(12) United States Patent
Kotaka

(10) Patent No.: US 7,024,615 B2
(45) Date of Patent: Apr. 4, 2006

(54) ARITHMETIC OPERATION METHOD FOR CYCLIC REDUNDANCY CHECK AND ARITHMETIC OPERATION CIRCUIT FOR CYCLIC REDUNDANCY CHECK

(75) Inventor: Shigenari Kotaka, Tokyo (JP)

(73) Assignee: NEC Electronics Corporation, (JP)

( * ) Notice: Subject to any disclaimer, the term of this patent is extended or adjusted under 35 U.S.C. 154(b) by 403 days.

(21) Appl. No.: 10/090,302

(22) Filed: Mar. 4, 2002

(65) Prior Publication Data

US 2002/0124226 A1 Sep. 5, 2002

(30) Foreign Application Priority Data

Mar. 5, 2001 (JP) .............................. 2001-059807

(51) Int. Cl.
*H03M 13/00* (2006.01)
(52) U.S. Cl. ....................................... 714/781; 714/799
(58) Field of Classification Search ................ 714/781, 714/775, 807, 752, 799, 800, 801, 746; 370/498
See application file for complete search history.

(56) References Cited

U.S. PATENT DOCUMENTS

| | | | | |
|---|---|---|---|---|
| 5,282,215 A | * | 1/1994 | Hyodo et al. | 714/775 |
| 6,324,670 B1 | * | 11/2001 | Henriksen | 714/807 |
| 6,516,004 B1 | * | 2/2003 | Douady et al. | 370/498 |
| 6,725,415 B1 | * | 4/2004 | Ishiwaki | 714/781 |

* cited by examiner

*Primary Examiner*—Albert Decady
*Assistant Examiner*—Dipakkumar Gandhi
(74) *Attorney, Agent, or Firm*—Hayes Soloway P.C.

(57) ABSTRACT

An arithmetic operation method for a cyclic redundancy check is provided which is capable of performing a high-speed arithmetic operation for the cyclic redundancy check.

A cyclic redundancy check 32 arithmetic operation is performed on byte data making up output data using a 32nd order generative polynomial. A cyclic redundancy check 16 arithmetic operation is performed on byte data making up the output data using a 16th order generative polynomial. The cyclic redundancy check 16 arithmetic operation is performed on byte data making up the output data and on arithmetic operation result being obtained in a midpoint in the cyclic redundancy check 32 arithmetic operation using the 16th order generative polynomial.

12 Claims, 20 Drawing Sheets

FIG.3

| | |
|---|---|
| C15 | Z01·Z03·Z04·Z07·Z08·Z10·Z11·Z12·Z13·Z15·R00·R02·R03·R04·R05·R08·R09·R11·R12·R19·R20·D00·D03·D04·D05·D06·D07·D10·D12·D14·D16·D17·D18·D19·D23·D25·D27·D29·D31 |
| C14 | Z00·Z02·Z03·Z06·Z07·Z09·Z10·Z11·Z12·Z14·Z15·R02·R06·R09·R12·R19·R22·R25·R27·R29·R31·D01·D02·D05·D07·D08·D10·D12·D13·D15·D16·D19·D23·D30 |
| C13 | Z01·Z02·Z05·Z06·Z08·Z09·Z10·Z11·Z13·Z14·Z15·R00·R01·R05·R07·R09·R10·R12·R13·R14·R15·D01·D02·D03·D04·D05·D08·D13·D14·D15·D18·D21·D22·D26·D27·D29·D30·D31 |
| C12 | Z00·Z01·Z04·Z05·Z07·Z08·Z09·Z10·Z12·Z13·Z14·Z15·R00·R01·R02·R03·R04·R08·R10·R13·R15·R21·R22·R23·R24·D01·D03·D07·D10·D14·D15·D17·D19·D21·D23·D24·D26·D28·D29 |
| C11 | Z00·Z01·Z06·Z09·Z10·Z14·R03·R04·R05·R07·R08·R11·R13·R15·R16·R18·R20·R22·R23·R25·R26·R27·R28·R29·R31·D00·D01·D03·D04·D08·D09·D10·D11·D13·D14·D17·D18·D23·D25·D27·D29·D30 |
| C10 | Z00·Z05·Z06·Z09·Z13·R00·R03·R04·R07·R09·R11·R12·R15·R17·R18·R25·R27·R29·R30·R31·D00·D01·D02·D07·D09·D14·D18·D21·D22·D24·D25·D26·D27·D30 |
| C09 | Z04·Z07·Z08·Z12·Z15·R02·R04·R05·R07·R12·R19·R20·R21·R22·R23·R25·R27·R30·R31·D03·D05·D07·D11·D13·D15·D18·D19·D21·D24·D25·D27·D29·D30 |
| C08 | Z03·Z06·Z07·Z11·Z14·Z15·R02·R09·R10·R11·R12·R13·R14·R16·R17·R18·R19·R21·R22·R24·R25·R27·R28·D01·D05·D07·D09·D14·D15·D16·D17·D19·D21·D23·D27·D28 |
| C07 | Z02·Z05·Z08·Z10·Z13·Z14·Z15·R00·R01·R02·R03·R04·R05·R06·R09·R10·R11·R12·R13·R15·R17·R20·R21·R22·R23·R26·R27·R30·R31·D05·D08·D09·D10·D11·D12·D14·D17·D18·D19·D22·D24·D26·D27·D31 |
| C06 | Z01·Z04·Z05·Z09·Z12·Z13·Z14·R07·R08·R10·R12·R14·R15·R18·R22·R27·R28·R29·R30·D00·D02·D03·D04·D06·D11·D13·D14·D16·D20·D22·D23·D25·D26 |
| C05 | Z00·Z03·Z04·Z08·Z11·Z12·Z13·R00·R03·R04·R05·R06·R09·R10·R14·R16·R18·R19·R20·R26·R29·R31·D00·D02·D04·D05·D07·D09·D17·D21·D23·D24·D26·D27·D28·D29·D30·D31 |
| C04 | Z02·Z03·Z07·Z10·Z11·Z12·Z15·R02·R04·R12·R14·R17·R18·R20·R22·R23·R26·D00·D02·D03·D04·D05·D10·D11·D12·D13·D14·D17·D18·D20·D23·D25·D26·D27·D29·D31 |
| C03 | Z01·Z02·Z06·Z09·Z10·Z11·Z14·R01·R02·R04·R06·R07·R08·R09·R13·R14·R15·R16·R21·R24·R26·R28·D04·D05·D06·D10·D14·D15·D16·D17·D18·D19·D20·D21·D22·D23·D24·D26·D28·D29·D30 |
| C02 | Z00·Z03·Z04·Z05·Z07·Z08·Z11·Z12·R01·R02·R03·R04·R05·R08·R09·R11·R13·R14·R15·R17·R19·R20·R23·R24·R26·R27·R28·R29·R30·D01·D04·D05·D07·D08·D14·D15·D16·D18·D19·D21·D22·D23·D26·D27·D28 |
| C01 | Z02·Z03·Z04·Z06·Z09·Z10·Z11·Z15·R00·R01·R02·R04·R07·R08·R11·R14·R15·R16·R20·R21·R22·R23·R25·R26·R30·D00·D01·D03·D05·D07·D08·D12·D16·D17·D19·D22·D23·D24·D26·D29·D31 |
| C00 | Z02·Z04·Z05·Z06·Z09·Z11·Z12·Z13·Z14·R01·R04·R05·R06·R09·R10·R13·R14·R19·R22·R24·R26·R31·D00·D01·D02·D04·D06·D09·D12·D13·D19·D20·D21·D25·D27·D29·D30·D31 |

FIG.4

| | |
|---|---|
| C15 | R01·R03·R04·R07·R08·R10·R11·R12·R13·R15·D00·D02·D03·D04·D05·D07·D08·D11·D12·D14·D18·D19·D20·D21·D23·D27·D30·D32·D33·D35·D36·D38·D41·D43·D44·D49·D51·D52·D56·D60 |
| C14 | R00·R02·R03·R06·R07·R09·R10·R11·R12·R14·R15·D00·D01·D03·D04·D05·D06·D08·D09·D12·D13·D15·D19·D20·D21·D22·D24·D28·D31·D33·D34·D36·D37·D39·D42·D44·D45·D50·D52·D53·D57·D61 |
| C13 | R01·R02·R05·R06·R08·R09·R10·R11·R13·R14·R15·D00·D01·D02·D04·D05·D06·D07·D09·D10·D13·D14·D18·D20·D21·D22·D23·D25·D29·D32·D34·D35·D37·D38·D40·D43·D45·D48·D51·D53·D54·D58·D62 |
| C12 | R00·R01·R04·R05·R07·R08·R09·R10·R12·R13·R14·R15·D00·D01·D02·D03·D05·D06·D07·D08·D10·D11·D14·D15·D17·D21·D22·D23·D24·D26·D30·D33·D35·D36·D38·D39·D41·D44·D46·D47·D52·D54·D55·D59·D63 |
| C11 | R00·R01·R06·R09·R10·R14·D01·D05·D08·D09·D14·D15·D16·D19·D20·D21·D22·D24·D30·D31·D32·D33·D34·D35·D37·D38·D39·D40·D41·D42·D43·D44·D45·D47·D48·D49·D51·D52·D53·D55 |
| C10 | R00·R05·R08·R09·R13·D02·D06·D07·D10·D15·D16·D17·D20·D21·D22·D23·D25·D26·D31·D32·D33·D34·D35·D36·D38·D39·D40·D41·D42·D43·D44·D45·D46·D48·D49·D50·D52·D53·D54·D56 |
| C09 | R04·R07·R08·R12·R15·D00·D03·D07·D08·D11·D16·D17·D18·D21·D22·D23·D24·D26·D27·D32·D33·D34·D35·D36·D37·D39·D40·D41·D42·D43·D44·D45·D46·D47·D49·D50·D51·D53·D54·D55·D57 |
| C08 | R03·R06·R07·R11·R14·R15·D00·D01·D04·D06·D09·D12·D17·D18·D19·D22·D23·D24·D25·D27·D28·D33·D34·D35·D36·D37·D38·D40·D41·D42·D43·D44·D45·D46·D47·D48·D50·D51·D52·D54·D55·D56·D58 |
| C07 | R02·R05·R06·R10·R13·R14·R15·D00·D01·D02·D05·D09·D10·D13·D18·D19·D20·D23·D24·D25·D26·D28·D29·D34·D35·D36·D37·D38·D39·D41·D42·D43·D44·D45·D46·D47·D48·D49·D51·D52·D53·D55·D56·D57·D59 |
| C06 | R01·R04·R05·R09·R12·R13·R14·D01·D02·D03·D06·D10·D11·D14·D19·D20·D21·D24·D25·D26·D27·D29·D30·D35·D36·D37·D38·D39·D40·D42·D43·D44·D45·D46·D47·D48·D49·D50·D52·D53·D54·D56·D57·D58·D60 |
| C05 | R00·R03·R04·R08·R11·R12·R13·D02·D03·D04·D07·D11·D12·D15·D20·D21·D22·D25·D26·D27·D28·D30·D31·D36·D37·D38·D39·D40·D41·D43·D44·D45·D46·D47·D48·D49·D50·D51·D53·D54·D55·D57·D58·D59·D61 |
| C04 | R02·R03·R07·R10·R11·R12·R15·D00·D03·D04·D05·D08·D12·D13·D16·D21·D22·D23·D26·D27·D28·D29·D31·D32·D37·D38·D39·D40·D41·D42·D44·D45·D46·D47·D48·D49·D50·D51·D52·D54·D55·D56·D58·D59·D60·D62 |
| C03 | R01·R02·R06·R09·R10·R11·R14·D01·D04·D05·D06·D09·D13·D14·D17·D22·D23·D24·D27·D28·D29·D30·D32·D33·D38·D39·D40·D41·D42·D43·D45·D46·D47·D48·D49·D50·D51·D52·D53·D55·D56·D57·D59·D60·D61·D63 |
| C02 | R00·R03·R04·R05·R07·R09·R11·R12·D03·D04·D06·D08·D10·D11·D12·D15·D19·D20·D21·D24·D25·D27·D28·D29·D31·D32·D34·D35·D36·D38·D39·D40·D42·D46·D47·D48·D50·D53·D54·D57·D58·D61·D62 |
| C01 | R02·R03·R04·R06·R08·R10·R11·R15·D00·D04·D05·D07·D09·D11·D12·D13·D16·D20·D21·D22·D25·D26·D28·D29·D30·D32·D33·D35·D36·D37·D39·D40·D41·D43·D47·D48·D49·D51·D54·D55·D58·D59·D62·D63 |
| C00 | R02·R04·R05·R08·R09·R11·R12·R13·R14·D01·D02·D03·D04·D06·D07·D10·D11·D13·D17·D18·D19·D20·D22·D26·D29·D31·D32·D34·D35·D37·D40·D42·D43·D49·D50·D51·D55·D59·D63 |

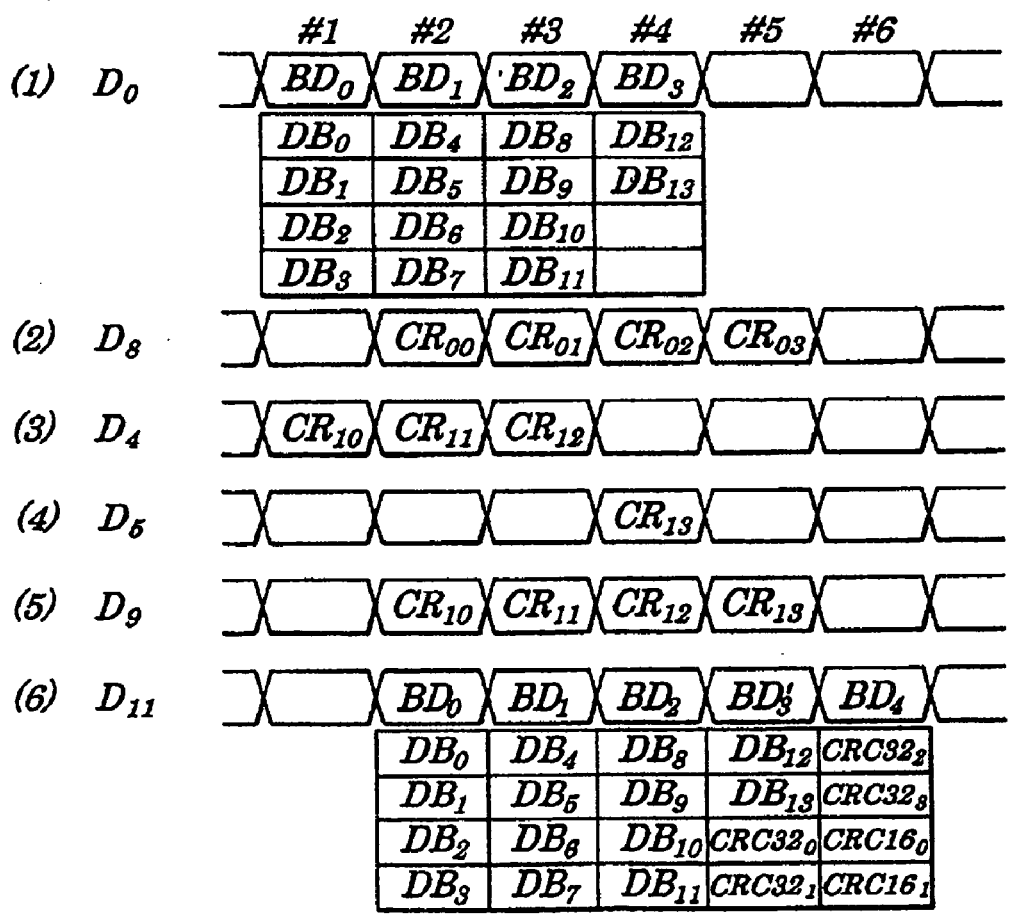

FIG.11

| | |
|---|---|
| C15 | Z01·Z04·Z08·Z10·Z11·Z12·Z13·<br>R00·R02·R03·R04·R05·R06·R10·R11·R12·R13·R15·<br>D00·D07·D09·D10·D12·D13·D14·D15·D16·D18·D19·D20·D21·D22·D23·D24·D26·D27·D28·D29·D31 |
| C14 | Z00·Z03·Z07·Z09·Z10·Z11·Z12·<br>R01·R03·R04·R05·R06·R07·R11·R12·R13·R14·<br>D01·D02·D05·D08·D09·D10·D11·D14·D15·D16·D18·D21·D22·D24·D25·D26·D29·D30 |
| C13 | Z02·Z06·Z08·Z09·Z10·Z11·Z15·<br>R00·R02·R06·R08·R10·R14·<br>D00·D01·D04·D08·D15·D16·D19·D27·D30·D31 |
| C12 | Z01·Z05·Z07·Z08·Z09·Z10·Z14·<br>R01·R03·R07·R09·R11·R15·<br>D00·D01·D04·D05·D07·D10·D12·D19·D21·D22·D25·D31 |
| C11 | Z00·Z01·Z06·Z07·Z09·Z10·Z11·Z12·Z15·<br>R00·R03·R04·R06·R07·R08·R10·R11·R12·<br>D00·D06·D07·D11·D12·D14·D16·D18·D19·D20·D23·D27·D28·D29 |
| C10 | Z00·Z05·Z06·Z08·Z09·Z10·Z11·Z14·Z15·<br>R01·R04·R05·R07·R08·R09·R11·R12·R13·<br>D00·D01·D02·D03·D05·D08·D09·D11·D14·D15·D17·D18·D21·D22·D26·D27·D28·D29 |
| C09 | Z04·Z05·Z07·Z08·Z09·Z10·Z13·Z14·Z15·<br>R00·R02·R05·R06·R08·R09·R10·R12·R13·R14·<br>D00·D03·D06·D09·D11·D13·D15·D16·D17·D21·D22·D25·D26·D27·D28·D30·D31 |
| C08 | Z03·Z04·Z06·Z07·Z08·Z09·Z12·Z13·Z14·<br>R01·R03·R06·R07·R09·R10·R11·R13·R14·R15·<br>D00·D03·D04·D05·D07·D11·D14·D20·D23·D24·D25·D26·D27·D28·D30·D31 |
| C07 | Z02·Z03·Z05·Z06·Z07·Z08·Z11·Z12·Z13·<br>R02·R05·R08·R11·R13·R14·<br>D01·D03·D06·D09·D12·D17·D18·D25·D26·D27·D28·D29·D30 |
| C06 | Z01·Z02·Z04·Z05·Z06·Z07·Z10·Z11·Z12·<br>R03·R04·R05·R06·R07·R09·R10·R13·R14·<br>D01·D02·D03·D04·D06·D12·D13·D14·D16·D24·D26·D28·D29 |
| C05 | Z00·Z01·Z03·Z04·Z05·Z06·Z09·Z10·Z11·<br>R06·R08·R11·R12·R13·R14·<br>D01·D02·D03·D05·D06·D07·D10·D11·D12·D14·D15·D16·D18·D24·D25·D26·D28 |
| C04 | Z00·Z02·Z03·Z04·Z05·Z06·Z09·Z10·Z15·<br>R00·R07·R09·R12·R13·R14·R15·<br>D01·D02·D03·D05·D07·D08·D10·D11·D12·D13·D16·D17·D19·D20·D23·D24·D31 |
| C03 | Z01·Z02·Z03·Z04·Z07·Z08·Z09·Z14·<br>R01·R08·R10·R13·R14·R15·<br>D00·D02·D05·D06·D08·D11·D12·D13·D17·D18·D19·D20·D21·D22·D23·D26·D28·D30·D31 |
| C02 | Z00·Z02·Z03·Z04·Z06·Z07·Z10·Z11·Z12·<br>R03·R06·R07·R09·R14·R15·<br>D00·D01·D03·D04·D05·D06·D11·D13·D15·D19·D21·D22·D24·D25·D26·D28·D29·D30 |
| C01 | Z01·Z02·Z03·Z05·Z06·Z09·Z10·Z11·Z15·<br>R00·R05·R08·R12·R13·<br>D00·D02·D03·D04·D05·D06·D07·D09·D12·D13·D14·D15·D18·D19·D21·D22·D25·D27·D28·D30 |
| C00 | Z00·Z02·Z05·Z09·Z11·Z12·Z13·Z14·<br>R01·R02·R03·R04·R05·R09·R10·R11·R12·R14·R15·<br>D00·D02·D05·D11·D12·D14·D15·D21·D22·D25·D30 |

FIG.12

| | |
|---|---|
| C15 | Z01·Z04·Z06·Z10·Z11·Z12·Z13·<br>D02·D03·D04·D05·D07·D11·D14·D16·D17·D19·D20·D22·D25·D27·D28·D33·<br>D35·D36·D40·D44 |
| C14 | Z00·Z03·Z07·Z09·Z10·Z11·Z12·<br>D03·D04·D05·D06·D08·D12·D15·D17·D18·D20·D21·D23·D26·D28·D29·D34·<br>D36·D37·D41·D45 |
| C13 | Z02·Z06·Z08·Z09·Z10·Z11·Z15·<br>D00·D04·D05·D06·D07·D09·D13·D16·D18·D19·D21·D22·D24·D27·D29·D30·<br>D35·D37·D38·D42·D46 |
| C12 | Z01·Z05·Z07·Z08·Z09·Z10·Z14·<br>D01·D05·D06·D07·D08·D10·D14·D17·D19·D20·D22·D23·D25·D28·D30·D31·<br>D36·D38·D39·D43·D47 |
| C11 | Z00·Z01·Z06·Z07·Z09·Z10·Z11·Z12·Z15·<br>D00·D03·D04·D05·D06·D08·D09·D14·D15·D16·D17·D18·D19·D21·D22·D23·<br>D24·D25·D26·D27·D28·D29·D31·D32·D33·D35·D36·D37·D39 |
| C10 | Z00·Z05·Z06·Z08·Z09·Z10·Z11·Z14·Z15·<br>D00·D01·D04·D05·D06·D07·D09·D10·D15·D16·D17·D18·D19·D20·D22·D23·<br>D24·D25·D26·D27·D28·D29·D30·D32·D33·D34·D37·D36·D38·D40 |
| C09 | Z04·Z05·Z07·Z08·Z09·Z10·Z13·Z14·Z15·<br>D00·D01·D02·D05·D06·D07·D08·D10·D11·D16·D17·D18·D19·D20·D21·D23·<br>D24·D25·D26·D27·D28·D29·D30·D31·D33·D34·D35·D37·D38·D39·D41 |
| C08 | Z03·Z04·Z06·Z07·Z08·Z09·Z12·Z13·Z14·<br>D01·D02·D03·D06·D07·D08·D09·D11·D12·D17·D18·D19·D20·D21·D22·D24·<br>D25·D26·D27·D28·D29·D30·D31·D32·D34·D35·D36·D38·D39·D40·D42 |
| C07 | Z02·Z03·Z05·Z06·Z07·Z08·Z11·Z12·Z13·<br>D02·D03·D04·D07·D08·D09·D10·D12·D13·D18·D19·D20·D21·D22·D23·D25·<br>D26·D27·D28·D29·D30·D31·D32·D33·D35·D36·D37·D39·D40·D41·D43 |
| C06 | Z01·Z02·Z04·Z05·Z06·Z07·Z10·Z11·Z12·<br>D03·D04·D05·D08·D09·D10·D11·D13·D14·D19·D20·D21·D22·D23·D24·D26·<br>D27·D28·D29·D30·D31·D32·D33·D34·D36·D37·D38·D40·D41·D42·D44 |
| C05 | Z00·Z01·Z03·Z04·Z05·Z06·Z09·Z10·Z11·<br>D04·D05·D06·D09·D10·D11·D12·D14·D15·D20·D21·D22·D23·D24·D25·D27·<br>D28·D29·D30·D31·D32·D33·D34·D35·D37·D38·D39·D41·D42·D43·D45 |
| C04 | Z00·Z02·Z03·Z04·Z05·Z08·Z09·Z10·Z15·D00·D05·D06·D07·D10·D11·D12·D13·<br>D15·D16·D21·D22·D23·D24·D25·D26·D28·D29·D30·D31·D32·D33·D34·D35·<br>D36·D38·D39·D40·D42·D43·D44·D46 |
| C03 | Z01·Z02·Z03·Z04·Z07·Z08·Z09·Z14·<br>D01·D06·D07·D08·D11·D12·D13·D14·D16·D17·D22·D23·D24·D25·D26·D27·<br>D29·D30·D31·D32·D33·D34·D35·D36·D37·D39·D40·D41·D43·D44·D45·D47 |
| C02 | Z00·Z02·Z03·Z04·Z06·Z07·Z10·Z11·Z12·<br>D03·D04·D05·D08·D09·D11·D12·D13·D15·D16·D18·D19·D20·D22·D23·D24·<br>D26·D30·D31·D32·D34·D37·D38·D41·D42·D45·D46· |
| C01 | Z01·Z02·Z03·Z05·Z06·Z09·Z10·Z11·Z15·<br>D00·D04·D05·D06·D09·D10·D12·D13·D14·D16·D17·D19·D20·D21·D23·D24·<br>D25·D27·D31·D32·D33·D35·D36·D39·D42·D43·D46·D47 |
| C00 | Z00·Z02·Z05·Z09·Z11·Z12·Z13·Z14·<br>D01·D02·D03·D04·D06·D10·D13·D15·D16·D18·D19·D21·D24·D26·D27·D32·<br>D34·D35·D39·D43·D47 |

FIG.13

| | |
|---|---|
| O15 | R01·R03·R04·R07·R08·R10·R11·R12·R13·R15·Z03·Z04·Z05·Z08·Z10·Z11·Z12·X01·X05·X06·X07·X09·X14·D00·D01·D02·D06·D08·D16·D19·D20·D23·D24·D26·D28 |
| O14 | R00·R02·R03·R06·R07·R09·R10·R11·R12·R14·R15·Z00·Z04·Z05·Z08·Z09·Z11·Z12·Z13·X00·X03·X05·X08·X09·X11·X12·X13·X14·D00·D03·D04·D05·D06·D07·D08·D11·D13·D15·D17·D18·D19·D24·D27·D28·D29·D30 |
| O13 | R01·R02·R05·R06·R08·R09·R10·R11·R13·R14·R15·Z00·Z01·Z02·Z06·Z07·Z08·Z10·Z11·X01·X04·X05·X06·X07·X08·X11·X12·X13·X15·D01·D03·D04·D08·D11·D14·D15·D18·D20·D21·D22·D23·D31 |
| O12 | R00·R01·R04·R05·R07·R08·R09·R10·R12·R13·R14·R15·Z00·Z01·Z02·Z03·Z04·Z05·Z08·Z11·Z13·Z15·X00·X03·X04·X05·X06·X07·X10·X11·X12·X14·D06·D09·D10·D11·D13·D15·D21·D22·D24·D26·D31 |
| O11 | R00·R01·R06·R09·R10·R14·Z00·Z01·Z04·Z06·Z07·Z08·Z15·X03·X04·X05·X06·X07·X11·X13·X14·X15·D02·D04·D05·D06·D07·D09·D10·D12·D16·D20·D21·D22·D23·D24·D25·D26·D28·D31 |
| O10 | R00·R05·R06·R08·R13·Z01·Z02·Z04·Z08·Z09·Z10·Z12·Z13·Z15·X02·X05·X06·X10·X11·X13·D00·D02·D03·D04·D06·D11·D14·D15·D16·D18·D19·D21·D22·D24·D26·D28·D31 |
| O09 | R04·R07·R08·R12·R15·Z02·Z03·Z05·Z08·Z10·Z11·Z13·Z14·X01·X04·X06·X09·X10·X12·D00·D01·D02·D04·D08·D10·D12·D13·D14·D16·D17·D19·D25·D26·D27·D29·D30 |
| O08 | R03·R06·R07·R11·R14·R15·Z03·Z04·Z06·Z10·Z11·Z12·Z14·Z15·X00·X04·X06·X07·X08·X12·X14·X15·D00·D01·D05·D07·D09·D15·D18·D21·D22·D24·D25·D26·D27·D28·D30 |
| O07 | R02·R05·R06·R10·R13·R14·R15·Z00·Z02·Z05·Z09·Z10·Z12·Z13·Z14·X01·X02·X03·X07·X10·X11·X13·X14·D00·D01·D02·D03·D04·D05·D06·D08·D09·D12·D13·D14·D15·D17·D19·D26·D28·D30 |
| O06 | R01·R04·R05·R09·R12·R13·R14·Z00·Z01·Z02·Z03·Z04·Z06·Z07·Z09·Z13·X00·X03·X04·X05·X06·X11·X13·X14·X15·D00·D02·D03·D04·D09·D11·D13·D16·D17·D20·D21·D22·D23·D24·D25 |
| O05 | R00·R03·R04·R08·R11·R12·R13·Z00·Z01·Z03·Z04·Z07·Z08·Z09·Z10·Z11·Z12·Z13·X01·X09·X11·X13·X15·D00·D02·D04·D05·D08·D17·D20·D23·D26·D27·D28·D29·D31 |
| O04 | R02·R03·R07·R10·R11·R12·R15·Z01·Z02·Z07·Z09·Z08·Z11·Z14·Z15·X00·X03·X04·X06·X08·X09·X10·X11·D01·D03·D04·D09·D11·D14·D15·D18·D20·D21·D22·D23·D31 |
| O03 | R01·R02·R06·R08·R10·R11·R14·Z00·Z02·Z03·Z04·Z05·Z07·Z08·Z09·Z13·X02·X04·X05·X06·X07·X08·X10·X11·X12·X14·X15·D00·D02·D03·D12·D13·D14·D15·D16·D24·D26·D27·D28·D29·D30·D31 |
| O02 | R00·R03·R04·R05·R07·R08·R11·R12·Z00·Z01·Z02·Z04·Z06·Z07·Z10·Z12·Z15·X01·X02·X05·X09·X12·X13·X14·D00·D01·D02·D03·D04·D05·D09·D12·D18·D20·D23·D25·D30·D31 |
| O01 | R02·R03·R04·R06·R08·R10·R11·R15·Z01·Z03·Z07·Z08·Z09·Z12·Z14·X00·X02·X03·X05·X06·X09·X10·X13·X14·X15·D02·D03·D04·D07·D08·D09·D10·D11·D12·D14·D15·D17·D18·D19·D25·D26·D27·D28·D29·D31 |
| O00 | R02·R04·R05·R06·R08·R11·R12·R13·R14·Z02·Z03·Z04·Z07·Z09·Z10·Z11·X02·X04·X05·X06·X08·X12·X13·D01·D05·D08·D09·D11·D12·D13·D16·D17·D18·D21·D22·D24·D30·D31 |

FIG.14

|  | #1 | #2 | #3 | #4 | #5 | #6 |
|---|---|---|---|---|---|---|
| (1) $D_0$ | $BD_0$ | $BD_1$ | $BD_2$ | $BD_3$ | | |
| | $DB_0$ | $DB_4$ | $DB_8$ | $DB_{12}$ | | |
| | $DB_1$ | $DB_5$ | $DB_9$ | | | |
| | $DB_2$ | $DB_6$ | $DB_{10}$ | | | |
| | $DB_3$ | $DB_7$ | $DB_{11}$ | | | |
| (2) $D_4$ | $CR_{00}$ | $CR_{01}$ | $CR_{02}$ | $CR_{03}$ | | |
| (3) $D_{12}$ | | $CR_{00}$ | $CR_{01}$ | $CR_{02}$ | $CR_{03}$ | |
| (4) $D_5$ | $CR_{10}$ | $CR_{11}$ | $CR_{12}$ | | | |
| (5) $D_6$ | | | | $CR_{13}$ | | |
| (6) $D_{13}$ | | $CR_{10}$ | $CR_{11}$ | $CR_{12}$ | $CR_{13}$ | |
| (7) $D_7$ | $CR_{20}$ | $CR_{21}$ | $CR_{22}$ | | | |
| (8) $D_8$ | | | | $CR_{23}$ | | |
| (9) $D_{14}$ | | $CR_{20}$ | $CR_{21}$ | $CR_{22}$ | $CR_{23}$ | |
| (10) $D_{16}$ | | $BD_0$ | $BD_1$ | $BD_2$ | $BD_3$ | $BD_4$ |
| | | $DB_0$ | $DB_4$ | $DB_8$ | $DB_{12}$ | $CRC16_{21}$ |
| | | $DB_1$ | $DB_5$ | $DB_9$ | $CRC16_{10}$ | $CRC16_{30}$ |
| | | $DB_2$ | $DB_6$ | $DB_{10}$ | $CRC16_{11}$ | $CRC16_{31}$ |
| | | $DB_3$ | $DB_7$ | $DB_{11}$ | $CRC16_{20}$ | |

FIG.20 (PRIOR ART)

| | |
|---|---|
| C31 | R05·R08·R09·R11·R15·R23·R24·R25·R27·R28·R29·R30·R31·<br>D00·D01·D02·D03·D04·D06·D08·D16·D20·D22·D23·D26 |
| C30 | R04·R07·R08·R10·R14·R22·R23·R24·R26·R27·R28·R29·R30·<br>D01·D02·D03·D04·D05·D07·D08·D09·D17·D21·D23·D24·D27 |
| C29 | R03·R06·R07·R09·R13·R21·R22·R23·R25·R26·R27·R28·R29·R31·<br>D00·D02·D03·D04·D05·D06·D08·D09·D10·D18·D22·D24·D25·D28 |
| C28 | R02·R05·R06·R08·R12·R20·R21·R22·R24·R25·R26·R27·R28·R30·<br>D01·D03·D04·D05·D06·D07·D09·D10·D11·D19·D23·D25·D26·D29 |
| C27 | R01·R04·R05·R07·R11·R19·R20·R21·R23·R24·R25·R26·R27·R29·<br>D02·D04·D05·D06·D07·D08·D10·D11·D12·D20·D26·D27·D30 |
| C26 | R00·R03·R04·R06·R10·R18·R19·R20·R22·R23·R24·R25·R26·R27·R28·<br>R31·D00·D03·D05·D06·D07·D08·D09·D11·D12·D13·D21·D25·D27·D28·D31 |
| C25 | R02·R03·R08·R11·R15·R17·R18·R19·R21·R22·R28·R29·R31·<br>D00·D02·D03·D09·D10·D12·D13·D14·D16·D20·D23·D28·D29 |
| C24 | R01·R02·R07·R10·R14·R16·R17·R18·R20·R21·R27·R28·R30·<br>D01·D03·D04·D10·D11·D13·D14·D15·D17·D21·D24·D28·D30 |
| C23 | R00·R01·R06·R09·R13·R15·R16·R17·R19·R20·R26·R27·R29·R31·<br>D00·D02·D04·D05·D11·D12·D14·D15·D16·D18·D22·D25·D30·D31 |
| C22 | R00·R09·R11·R12·R14·R16·R18·R19·R23·R24·R26·R27·R29·R31·<br>D00·D02·D04·D05·D07·D08·D12·D13·D15·D17·D19·D20·D22·D31 |
| C21 | R05·R09·R10·R13·R17·R18·R22·R24·R26·R27·R29·R31·<br>D00·D02·D04·D05·D07·D09·D13·D14·D18·D21·D22·D29 |
| C20 | R04·R08·R09·R12·R16·R17·R21·R23·R25·R26·R28·R30·<br>D01·D03·D05·D06·D08·D10·D14·D15·D19·D22·D23·D27 |
| C19 | R03·R07·R08·R11·R15·R16·R20·R22·R24·R25·R27·R29·<br>D02·D04·D06·D07·D09·D11·D15·D16·D20·D23·D24·D28 |
| C18 | R02·R06·R07·R10·R14·R15·R19·R21·R23·R24·R26·R28·R31·<br>D00·D03·D05·D07·D08·D10·D12·D16·D17·D21·D24·D25·D29 |
| C17 | R01·R05·R06·R09·R13·R14·R18·R20·R22·R25·R27·R30·R31·<br>D00·D01·D04·D06·D08·D09·D11·D13·D17·D18·D22·D25·D26·D30 |
| C16 | R00·R04·R05·R08·R12·R13·R17·R19·R21·R22·R24·R26·R29·R30·<br>D01·D02·D05·D07·D09·D10·D12·D14·D18·D19·D23·D26·D27·D31 |

*FIG.21 (PRIOR ART)*

| | |
|---|---|
| C15 | R03·R04·R05·R07·R08·R09·R12·R15·R16·R18·R20·R21·R24·R27·R30·D01·D04·D07·D10·D11·D13·D15·D16·D19·D22·D23·D24·D26·D27·D28 |
| C14 | R02·R03·R04·R06·R07·R08·R11·R14·R15·R17·R19·R20·R23·R26·R29·D02·D05·D08·D11·D12·D14·D16·D17·D20·D23·D24·D25·D27·D28·D29 |
| C13 | R01·R02·R03·R05·R06·R07·R10·R13·R16·R19·R22·R26·R31·D00·D03·D06·D09·D12·D13·D15·D17·D18·D21·D24·D25·D26·D28·D29·D30 |
| C12 | R00·R01·R02·R04·R05·R06·R09·R12·R13·R15·R17·R18·R24·R30·R31·D00·D01·D04·D07·D10·D13·D14·D16·D18·D19·D22·D25·D26·D27·D29·D30·D31 |
| C11 | R00·R01·R03·R04·R09·R12·R14·R15·R16·R17·R20·R24·R25·R26·R27·R28·R31·D00·D03·D04·D05·D06·D07·D11·D14·D15·D16·D17·D19·D22·D27·D28·D30·D31 |
| C10 | R00·R02·R03·R05·R09·R13·R14·R16·R19·R26·R28·R29·R31·D00·D02·D03·D05·D12·D15·D17·D18·D22·D26·D28·D29·D31 |
| C09 | R01·R02·R04·R05·R09·R11·R12·R13·R18·R23·R24·R29·D02·D07·D08·D13·D16·D19·D20·D22·D26·D27·D29·D30 |
| C08 | R00·R01·R03·R04·R08·R10·R11·R17·R22·R28·R31·D00·D03·D08·D09·D14·D19·D20·D21·D23·D27·D28·D30·D31 |
| C07 | R00·R02·R03·R05·R07·R08·R10·R15·R16·R21·R22·R23·R24·R28·R29·D02·D03·D06·D07·D08·D09·D10·D15·D16·D21·D23·D24·D26·D28·D29·D31 |
| C06 | R01·R02·R04·R05·R06·R07·R08·R11·R20·R21·R25·R30·D01·D02·D06·D09·D10·D11·D17·D20·D23·D24·D25·D26·D27·D29·D30 |
| C05 | R00·R01·R03·R04·R05·R06·R07·R10·R13·R19·R20·R21·R24·R28·R29·D02·D03·D07·D10·D11·D12·D18·D21·D24·D25·D26·D27·D28·D30·D31 |
| C04 | R00·R02·R03·R04·R06·R08·R11·R12·R15·R18·R19·R20·R24·R26·R29·R30·R31·D00·D01·D02·D06·D07·D11·D12·D13·D16·D19·D20·D23·D25·D27·D28·D29·D31 |
| C03 | R01·R02·R03·R07·R08·R09·R10·R14·R15·R17·R18·R19·R25·R27·R31·D00·D04·D06·D12·D13·D14·D16·D17·D21·D22·D23·D24·D26·D29·D30 |
| C02 | R00·R02·R06·R07·R08·R09·R13·R14·R16·R17·R18·R24·R26·R30·R31·D00·D01·D05·D07·D13·D14·D15·D17·D18·D22·D23·D24·D25·D29·D30·D31 |
| C01 | R00·R01·R06·R07·R09·R11·R12·R13·R16·R17·R24·R27·R28·D03·D04·D07·D14·D15·D18·D19·D20·D22·D24·D25·D30·D31 |
| C00 | R00·R06·R09·R10·R12·R16·R24·R25·R26·R28·R29·R30·R31·D00·D01·D02·D03·D05·D06·D07·D15·D19·D21·D22·D26·D31 |

FIG.23 (PRIOR ART)

| | |
|---|---|
| C15 | R03·R04·R06·R09·R11·R12·R14·R15·<br>D00·D01·D03·D04·D06·D09·D11·D12·D17·D19·D20·D24·D28 |
| C14 | R02·R03·R05·R08·R10·R11·R13·R14·<br>D01·D02·D04·D05·D07·D10·D12·D13·D18·D20·D21·D25·D29 |
| C13 | R01·R02·R04·R07·R09·R10·R12·R13·R15·<br>D00·D02·D03·D05·D06·D08·D11·D13·D14·D19·D21·D22·D26·D30 |
| C12 | R00·R01·R03·R06·R08·R09·R11·R12·R14·<br>D01·D03·D04·D06·D07·D09·D12·D14·D15·D20·D22·D23·D27·D31 |
| C11 | R00·R02·R03·R04·R05·R06·R07·R08·R09·R10·R12·R13·R14·R15·<br>D00·D01·D02·D03·D05·D06·D07·D08·D09·D10·D11·D12·D13·D15·D16·D17·<br>D19·D20·D21·D23 |
| C10 | R01·R02·R03·R04·R05·R06·R07·R08·R09·R11·R12·R13·R14·R15·<br>D00·D01·D02·D03·D04·D06·D07·D08·D09·D10·D11·D12·D13·D14·D16·D17·<br>D18·D20·D21·D22·D24 |
| C09 | R00·R01·R02·R03·R04·R05·R06·R07·R08·R10·R11·R12·R13·R14·R15·<br>D00·D01·D02·D03·D04·D05·D07·D08·D09·D10·D11·D12·D13·D14·D15·D17·<br>D18·D19·D21·D22·D23·D25 |
| C08 | R00·R01·R02·R03·R04·R05·R06·R07·R09·R10·R11·R12·R13·R14·<br>D01·D02·D03·D04·D05·D06·D08·D09·D10·D11·D12·D13·D14·D15·D16·D18·<br>D19·D20·D22·D23·D24·D26 |
| C07 | R00·R01·R02·R03·R04·R05·R06·R08·R09·R10·R11·R12·R13·<br>D02·D03·D04·D05·D06·D07·D09·D10·D11·D12·D13·D14·D15·D16·D17·D19·<br>D20·D21·D23·D24·D25·D27 |
| C06 | R00·R01·R02·R03·R04·R05·R07·R08·R09·R10·R11·R12·<br>D03·D04·D05·D06·D07·D08·D10·D11·D12·D13·D14·D15·D16·D17·D18·D20·<br>D21·D22·D24·D25·D26·D28 |
| C05 | R00·R01·R02·R03·R04·R06·R07·R08·R09·R10·R11·<br>D04·D05·D06·D07·D08·D09·D11·D12·D13·D14·D15·D16·D17·D18·D19·D21·<br>D22·D23·D25·D26·D27·D29 |
| C04 | R00·R01·R02·R03·R05·R06·R07·R08·R09·R10·R15·<br>D00·D05·D06·D07·D08·D09·D10·D12·D13·D14·D15·D16·D17·D18·D19·D20·<br>D22·D23·D24·D26·D27·D28·D30 |
| C03 | R00·R01·R02·R04·R05·R06·R07·R08·R09·R14·R15·<br>D00·D01·D06·D07·D08·D09·D10·D11·D13·D14·D15·D16·D17·D18·D19·D20·<br>D21·D23·D24·D25·D27·D28·D29·D31 |
| C02 | R00·R01·R05·R07·R08·R09·R11·R12·R13·R15·<br>D00·D02·D03·D04·D06·D07·D08·D10·D14·D15·D16·D18·D21·D22·D25·D26·<br>D29·D30 |
| C01 | R00·R04·R06·R07·R08·R10·R11·R12·R14·R15·<br>D00·D01·D03·D04·D05·D07·D08·D09·D11·D15·D16·D17·D19·D22·D23·D26·<br>D27·D30·D31 |
| C00 | R04·R05·R07·R10·R12·R13·R15·<br>D00·D02·D03·D05·D08·D10·D11·D16·D18·D19·D23·D27·D31 |

FIG. 24
(PRIOR ART)

ARITHMETIC OPERATION METHOD FOR CYCLIC REDUNDANCY CHECK AND ARITHMETIC OPERATION CIRCUIT FOR CYCLIC REDUNDANCY CHECK

BACKGROUND OF THE INVENTION

1. Field of the Invention

The present invention relates to an arithmetic operation method for a cyclic redundancy check (CRC) and an arithmetic operation circuit for the CRC and more particularly to the arithmetic operation method for the CRC and the arithmetic operation circuit for the CRC being suitably usable when data communications are performed through different communications protocols.

The present application claims priority of Japanese Patent Application No.2001-059807 filed on Mar. 5, 2001, which is hereby incorporated by reference.

2. Description of the Related Art

FIG. 15 is a schematic block diagram showing an example of configurations of a conventional data communications system. As shown in FIG. 15, the conventional data communications system of the example is so configured that an information processing system 1 such as a personal computer or a like is connected through a network 4 such as an intranet, internet, or a like to a server 2 provided with a hard disc 3. As a communications protocol for data communications carried out between the information processing system 1 and the server 2, generally, a TCP/IP (Transmission Control Protocol/Internet Protocol) (hereinafter called a "general protocol") is used. As a communications protocol for data communications carried out between the server 2 and the hard disc 3, a new high-speed communications protocol (hereinafter called a "high-speed protocol") such as "InfiniBand" (Trade name) which is a next-generation interface for a server and can provide a data transmission speed of not less than 500 M byte/second is used.

Next, operations of the data communications system having the configurations described as above are explained in which access is made from the information processing system 1 to the server 2 through the network 4 and data stored in the hard disc 3 is read. First, the server 2, when receiving an access made from the information processing system 1 and a request for reading data stored in the hard disc 3, searches for a memory location in the hard disc 3 to acquire requested data. The hard disc 3 then reads the requested data and transmits read data to the server 2 through a cable 5. At this point, the data is incorporated into communications data configured in a data format shown in FIG. 16 and is transmitted 4 bytes by 4 bytes (32 bits) from the hard disc 3 to the server 2 in accordance with the high-speed protocol. As shown in FIG. 16, the communications data is made up of a header, data, and arithmetic operation results CRC32 and CRC16. The arithmetic operation result CRC32 represents a result obtained by an arithmetic operation for error detection by dividing the data to be transmitted into strings of data each being made up of 32 bits and by using a 32nd order generative polynomial expressed by a following equation (1) in accordance with CRC method which is one of error detection methods usable in data communications. Similarly, the arithmetic operation result CRC16 represents a result obtained by an arithmetic operation for error detection by dividing the data to be transmitted into strings of data each being of 16 bits and by using a 16th order generative polynomial shown in a following equation (2) in accordance with the CRC method. Hereinafter, the arithmetic operation for error detection using the 32nd order generative polynomial shown in the equation (1) is referred to as a "CRC32 operation" and the arithmetic operation for error detection using the 16th order generative polynomial shown in the equation (2) is referred to as a "CRC16 operation".

$$G(X)=X^{32}+X^{26}+X^{23}+X^{22}+X^{16}+X^{12}+X^{11}+X^8+X^7+X^5+X^4+X^2+X^1+1 \quad \text{Equation (1)}$$

$$G(X)=X^{16}+X^{12}+X^3+X^1+1 \quad \text{Equation (2)}$$

As shown in FIG. 17, the header and the data contained in the communications data are divided into "n" (n is a natural number) pieces of data blocks $DB_0$ to $DB_{n-1}$ each being made up of one byte. The arithmetic operation result CRC32 contained in the communications data is divided into four pieces of arithmetic operation result blocks $CRC32_0$ to $CRC32_3$ each being made up of one byte. The arithmetic operation result CRC16 contained in the communications data is divided into two pieces of arithmetic operation result blocks $CRC16_0$ to $CRC16_1$. The CRC32 operation is performed on the header and the data contained in the communications data. On the other hand, the CRC16 operation is performed on the header, data, and arithmetic operation result CRC32. That is, in the CRC16 operation, the arithmetic operation result CRC32 is treated the same as header and data contained in the communications data.

Next, the server 2, when having received the communications data from the hard disc 3, transmits new communications data obtained by removing a header prepared specifically for a high-speed protocol and the arithmetic operation result CRC16 from the received communications data to the information processing system 1 through the network 4.

As described above, in the conventional communications system, when the communications data is transmitted from the hard disc 3 to the server 2, the CRC 32 operation is performed to add the arithmetic operation blocks $CRC32_0$ to $CRC32_3$ to the communications data. Therefore, the CRC operation is not required when the communications data is transmitted from the server 2 to the information processing system 1, thus enabling communications data to be transmitted in a short time.

Next, configurations and operations of a conventional CRC arithmetic operation circuit are described which perform CRC operations when communications data is transmitted from the hard disc 3 to the server 2. FIG. 18 is a block diagram showing configurations of the conventional CRC arithmetic operation circuit. The conventional CRC arithmetic operation circuit includes a data inputting section 11, latches 12 to 16, selectors 17 and 18, arithmetic operation sections 19 and 20, and a data outputting section 21.

The data inputting section 11 is an interface to perform waveform shaping on input data $D_0$ being input 32 bits by 32 bits which is read from a specified memory area in the hard disc 3 and to input it as output data $D_1$ to circuit elements at a later stage. Each of the latches 12 and 13 is made up of a 32-bit flip-flop FF which is used to adjust timing for data processing. The latch 12 latches the output data $D_1$ from the data inputting section 11 for a period of time being equivalent to one clock fed from an outside and then outputs it as output data $D_2$. The latch 13 latches the output data $D_2$ from the latch 12 for a period of time being equivalent to one clock and outputs it as output data $D_4$. The latch 14 is made up of a 32-bit flip-flop FF and, in order to adjust timing with which data is input to the arithmetic operation section 20, latches the output data $D_1$ fed from the data inputting section 11 for a period of time being equivalent to one clock and outputs it as output data $D_2$.

The selector 17 selects either of the output data $D_2$ being output by 32 bits from the latch 14 or output data $D_5$ being output by 32 bits from the latch 15 and outputs it as output data $D_3$.

The arithmetic operation section 19 performs the CRC32 operation on the output data $D_1$ from the data inputting section 11 by using the output data $D_5$ from the latch 15. The arithmetic operation 20 performs the CRC16 operation on the output data $D_3$ by using output data $D_6$ from the latch 16. The latch 15 is made up of a 32-bit flip-flop FF and latches an arithmetic operation result of 32 bits output from the arithmetic operation section 19 for a period of time being equivalent to one clock and outputs it as the output data $D_5$. The latch 16 is made up of a 16-bit flip-flop FF and latches an arithmetic operation result of 16 bits output from the arithmetic operation section 20 for a period of time being equivalent to one clock and outputs it as output data $D_6$. The selector 18 selects any one of the output data $D_4$ being output by 32 bits from the latch 13, output data $D_5$ being output by 32 bits from the latch 15 and output data $D_6$ being output by 16 bits from the latch 16 and outputs it as output data $D_7$. The data outputting section 21 is an interface to perform waveform shaping on output data $D_7$ being output by 32 bits from the selector 18 and to feed it as output data $D_8$ to circuit elements at a later stage.

Next, configurations of the conventional arithmetic operation sections 19 and 20 will be described in detail.

The arithmetic operation section 19 produces an arithmetic operation result CRC32. A polynomial P(X) used to obtain the arithmetic operation result CRC32 is given below, in which a bit string having 32 bits "$d_{31}, d_{30}, \ldots, d_1, d_0$" is considered to be a value.

$$P(X)=d_{31}X^{31}+d_{30}X^{30}+\ldots+d_1X+d_0 \quad \text{Equation (3)}$$

In the above equation, the symbol "+" indicates that calculations are done by a "modulo-two addition" operation in the polynomial. The symbol "+" in the equations (1) and (2) and in the equations shown hereinafter has the same meaning as described above. The "modulo-two operation" refers to an operation in which calculations are done cyclically using only a binary number "0" or "1" without carrying over or rounding off a place and is defined by following equations (4) to (11).

$$0+0=0 \quad \text{Equation (4)}$$

$$0+1=1 \quad \text{Equation (5)}$$

$$1+0=1 \quad \text{Equation (6)}$$

$$1+1=0 \quad \text{Equation (7)}$$

$$0-0=0 \quad \text{Equation (8)}$$

$$0-1=1 \quad \text{Equation (9)}$$

$$1-0=1 \quad \text{Equation (10)}$$

$$1-1=0 \quad \text{Equation (11)}$$

That is, results from the "modulo-two operation" turn out to be the same as those obtained from an exclusive OR (EOR) operation in a logic circuit.

A result obtained by multiplying the input data P (X) by the highest order term $X^{32}$ included in the 32nd order generative polynomial G (X) shown in the equation (1) is represented by Q (X) shown in an equation (12). Then, the Q (X) is divided by the generative polynomial G (X) and its remainder is represented by R (X) shown in an equation (13). In the equation (13), each of $c_{31}, c_{30}, \ldots, c_1$, and $c_0$ is "0" or "1".

$$Q(X)=d_{31}X^{63}+d_{30}X^{62}+\ldots+d_1X^{33}+d_0X^{32} \quad \text{Equation (12)}$$

$$R(X)=c_{31}X^{31}+c_{30}X^{30}+\ldots+c_1X+c_0 \quad \text{Equation (13)}$$

Each of the "$c_{31}, c_{30}, \ldots, c_1, c_0$" constituting the remainder R (X) is a cyclic check bit of the arithmetic operation result CRC32, which is called a "CRC code". Moreover, a new Q (X) is produced by multiplying input data P' (X) to be input next by a CRC code obtained this time. By dividing the new Q (X) by the generative polynomial G (X), a new CRC code is obtained. When the processing described above is performed repeatedly (in a cyclic manner) on all the input data P (X), the arithmetic operation result CRC32 can be obtained.

As described above, in the CRC32 arithmetic operation, it is necessary to divide the Q (X) by the generative polynomial G (X). However, this division cannot be done simply by hardware because the hardware cannot perform high-speed processing or because large-sized circuits have to be used as the hardware and, therefore, the division is generally done using such the arithmetic operation section 19 as shown in FIG. 19. The arithmetic operation section 19 is made up of exclusive OR (EOR) gates $23_1$ to $23_{14}$ and delay flip-flops FF $24_1$ to FF $24_{32}$. This configuration is well known and; therefore its description is omitted accordingly. The output data C31 to C00 each being output from each of the delay flip-flops FF $24_{32}$ to FF $24_1$ when a clock used to shift 32 bits of data whose number of its bits is equal to that of the 32-bit input data P (X) is fed to the arithmetic operation section 19 shown in FIG. 19 represents the remainder "$c_{31}, c_{30}, \ldots, c_1, c_0$" of the CRC32 operation. FIGS. 20 and 21 show operational expressions for output data C31 to C00. In FIGS. 20 and 21, each of R31 to R00 is an initial value of each of the delay flip-flops FF $24_{32}$ to FF $24_1$ and each of D31 to D00 corresponds to each of the bit strings $d_{31}, d_{30}, \ldots, d_1, d_0$ making up the input data P (X) and the symbol "□" denotes an exclusive OR operation.

FIG. 22 is a block diagram showing configurations of the arithmetic operation section 20 in the conventional CRC arithmetic operation circuit. The conventional arithmetic operation section 20 is made up of exclusive OR (EOR) gates $26_1$ to $26_4$ and delay flip-flops FF $27_1$ to FF $27_{16}$. This configuration is well known and; therefore its description is omitted accordingly. The arithmetic operation section 20 produces an arithmetic operation result CRC16. The CRC16 operations are approximately the same as the CRC32 operation except that polynomials to be used are different from each other and their descriptions are omitted accordingly.

The output data C15 to C00 each being output from each of the FFs $27_{16}$ to $27_1$ when a clock to used shift 32 bits of data whose number of its bits is equal to that of the 32-bit input data P (X) is fed to the arithmetic operation section 20 shown in FIG. 23 represents the remainder of the CRC16 operation. FIG. 23 shows an operational expression for output data C15 to C00. In FIG. 23, each of R15 to R00 is an initial value of the $FF27_{16}$ to $FF27_1$ and each of the D31 to D00 corresponds to each of the strings of bits $d_{31}, d_{30}, \ldots, d_1, d_0$ making up the input data P (X) and the symbol "□" denotes the exclusive OR operation.

Next, operations of the conventional CRC arithmetic operation circuit are described by referring to a timing chart shown in FIG. 24. To simplify the description, let it be assumed that input data $D_0$ is made up of byte data $BD_0$ to $BD_3$ as shown in FIG. 24. The byte data $BD_0$ is made up of data blocks $DB_0$ to $DB_3$ each being of one byte and the byte data $BD_1$ is made up of data blocks $DB_4$ to $DB_7$ each being of one byte. The byte data $BD_2$ is made up of data blocks $DB_8$ to $DB_{11}$. The byte data $BD_3$ is made up of data blocks $DB_{12}$ and $DB_{13}$ each being of one byte.

First, as shown in FIG. 24(1), when the input data $D_0$ is sequentially fed from an outside to the CRC arithmetic operation circuit in synchronization with a clock (not shown), the data inputting section 11 performs waveform shaping on the input data $D_0$ starting from a first period #1 and feeds it as the output data $D_1$ to the latches 12 and 14 and to the arithmetic operation section 19 sequentially. Each of the latches 12 and 14 latches the output data $D_1$ fed from the data inputting section 11 for a period of time being equivalent to one clock fed from the outside and then outputs the latched data $D_1$ as the output date $D_2$ sequentially, starting from a second period #2.

On the other hand, the arithmetic operation section 19, during the first period #1, performs the CRC32 operation on the output data $D_1$, that is, on the byte data $BD_0$ in the example shown in FIG. 24 by using an output data $D_5$ output from the latch 15, that is, the initial value of the latch 15 in the example and produces an arithmetic operation result $CR_{00}$. In the latch 15, "0" is set in advance as its initial value. Then, the latch 15 latches the arithmetic operation result $CR_{00}$ output from the arithmetic operation section 19 for a period of time being equivalent to one clock and, as shown in FIG. 24(2), outputs it as the output data $D_5$ during the second period #2. Next, the arithmetic operation section 19, during the second period #2, performs the CRC32 operation on the output data $D_1$ from the data inputting section 11, that is, on the byte data $BD_1$ in the example shown in FIG. 24, by using the output data $D_5$ from the latch 15, that is, the arithmetic operation result $CR_{00}$ in the example and produces an arithmetic operation result $CR_{01}$. Then, the latch 15 latches the arithmetic operation result $CR_{01}$ for a period of time being equivalent to one clock and, as shown in FIG. 24(2), outputs it as the output data $D_5$ during a third period #3.

Similarly, the arithmetic operation section 19, during the third period #3, performs the CRC32 operation on the output data $D_1$ from the data inputting section 11, that is, on the byte data $BD_2$ in the example by using the output data $D_5$ from the latch 15, that is, the arithmetic operation result $CR_{01}$ in the example and produces an arithmetic operation result $CR_{02}$. Then, the latch 15 latches the arithmetic operation result $CR_{02}$ for a period of time being equivalent to one clock and, as shown in FIG. 24(2), outputs it as the output data $D_5$ during a fourth period #4. Next, the arithmetic operation section 19, during the fourth period #4, performs the CRC32 operation on the output data $D_1$ from the data inputting section 11, that is, on the byte data $BD_3$ in the example, by using the output data $D_5$ from the latch 15, that is, the arithmetic operation result $CR_{02}$ in the example and produces an arithmetic operation result $CR_{03}$. Then, the latch 15 latches the arithmetic operation result $CR_{03}$ for a period of time being equivalent to one clock and, as shown in FIG. 24(2), outputs it as the output data $D_5$ during a fifth period #5. This arithmetic operation result $CR_{03}$ becomes the arithmetic operation result CRC32. Thus, the arithmetic operation result CRC32 is made up of 4 pieces of arithmetic operation result blocks $CRC32_0$ to $CRC32_3$.

The selector 17, as shown in FIG. 24(4), during the second period #2 to the fourth period #4, selects the output data $D_2$ output from the latch 14, that is, any one of the byte data $BD_0$ to $BD_2$ in the example and outputs it as the output data $D_3$. Moreover, the selector 17, as shown in FIG. 24(4), during the fifth period #5, produces new byte data $BD'_3$ using data blocks $DB_{12}$ and $DB_{13}$ making up the byte data $BD_3$ and arithmetic operation blocks $CRC32_0$ and $CRC32_1$ making up the arithmetic operation result CRC32 and outputs it as the output data $D_3$. Furthermore, the selector 17, as shown in FIG. 24(4), produces new byte data $BD_4$ using arithmetic operation blocks $CRC32_2$ during the sixth period #6 and $CRC32_3$ making up the arithmetic operation result CRC32 and outputs it as the output data $D_3$.

Therefore, the arithmetic operation section 20, during the second period #2, performs the CRC16 operation on the output data $D_3$ from the selector 17, that is, on the byte data $BD_0$ in the example, by using output data $D_6$ from the latch 16, that is, the initial value of the latch 16 in the example and produces an arithmetic operation result $CR_{10}$. In the latch 16, "0" is set in advance as its initial value. Then, the latch 16 latches the arithmetic operation result $CR_{10}$ output from the arithmetic operation section 20 for a period of time being equivalent to one clock and, as shown in FIG. 24(5), outputs it as the output data $D_6$ during the third period #3. Next, the arithmetic operation section 20, during the third period #3, performs the CRC16 operation on the output data $D_3$ from the selector 17, that is, on the byte data $BD_1$ in the example, by using output data $D_6$ from the latch 16, that is, the arithmetic operation result $CR_{10}$ in the example and produces an arithmetic operation result $CR_{11}$. Then, the latch 16 latches the arithmetic operation result $CR_{11}$ for a period of time being equivalent to one clock and, as shown in FIG. 24(5), outputs it as the output data $D_6$ during the fourth period #4.

Similarly, the arithmetic operation section 20, during the fourth period #4, performs the CRC16 operation on the output data $D_3$ from the selector 17, that is, on the byte data $BD_2$ in the example, by using output data $D_6$ from the latch 16, that is, the arithmetic operation result $CR_{11}$ in the example and produces an arithmetic operation result $CR_{12}$. Then, the latch 16 latches the arithmetic operation result $CR_{12}$ for a period of time being equivalent to one clock and, as shown in FIG. 24(5), outputs it as the output data $D_6$ during the fifth period #5. Next, the arithmetic operation section 20, during the fifth period #5, performs the CRC16 operation on the output data $D_3$ from the selector 17, that is, on the byte data $BD'_3$ made up of the data blocks $DB_{12}$ and $DB_{13}$ and arithmetic operation result blocks $CRC32_0$ and $CRC32_1$ in the example, by using output data $D_6$ from the latch 16, that is, the arithmetic operation result $CR_{12}$ in the example and produces an arithmetic operation result $CR_{13}$. Then, the latch 16 latches the arithmetic operation result $CR_{13}$ for a period of time being equivalent to one clock and, as shown in FIG. 24(5), outputs it as the output data $D_6$ during a sixth period #6.

Then, the arithmetic operation section 20, during the sixth period #6, performs the CRC16 operation on the output data $D_3$ from the selector 17, that is, on the byte data $BD_4$ made up of arithmetic operation result blocks $CRC32_2$ and $CRC32_3$ in the example, by using output data $D_6$ from the latch 16, that is, the arithmetic operation result $CR_{13}$ and produces an arithmetic operation result $CR_{14}$. Then, the latch 16 latches the arithmetic operation result $CR_{14}$ for a period of time being equivalent to one clock and, as shown in FIG. 24(5), outputs it as the output data $D_6$ during a seventh period #7. This arithmetic operation result $CR_{14}$ becomes the arithmetic operation result CRC16. The arithmetic operation result CRC16, as described above, is made up of two pieces of the arithmetic operation results $CRC16_0$ and $CRC16_1$.

Then, the selector 18, during the third period #3 to fifth period #5, selects the output data $D_2$ output from the latch 13, that is, any one of the byte data $BD_0$ to $BD_2$ in the example and outputs it as output data $D_7$. Moreover, the selector 18, during the sixth period #6, outputs the byte data $BD'_3$ made up of data blocks $DB_{12}$ and $DB_{13}$ and the arithmetic operation result blocks $CRC32_0$ and $CRC32_1$ as the output data $D_7$. Furthermore, the selector 18, during the seventh period #7, produces new byte data $BD'_4$ using the arithmetic operation result blocks $CRC32_2$ and $CRC32_3$ making up the arithmetic operation result CRC32 and arithmetic operation result blocks $CRC16_0$ and $CRC16_1$ making up the arithmetic operation result CRC16 and outputs it as the output data $D_7$. Therefore, the data outputting section 21, as shown in FIG. 24(6), performs waveform shaping on the output data $D_7$ being output by 32 bits from the selector 18 and feeds it as an output data $D_8$ to circuit elements at a later stage.

Generally, in data communications, in order to transmit data accurately to a receiver, continuous transmission from a beginning to an end of the data transmission (in the case of a packet communication, during transmission of at least one packet) is required. To achieve this, in the conventional CRC arithmetic operation circuit described above, as shown in FIG. 24, an arithmetic operation result is added to an end of data to be transmitted so that both the data to be transmitted and the CRC arithmetic operation result are continuously transmitted without interruption.

In the conventional CRC arithmetic operation circuit, since the arithmetic operation result CRC32 obtained by the CRC operation is used to perform the CRC16 operation, it is necessary to add the arithmetic operation result CRC32 to an end of the output data $D_1$ fed from the data inputting section 11 and then to feed it to the arithmetic operation section 20.

However, as shown in FIG. 24(1), if an end of the output data $D_1$ being output by 32 bits from the data inputting section 11 is the byte data $BD_3$ being of two bytes, following inconvenience occurs. That is, since the arithmetic operation result CRC32 is made up of four arithmetic operation result blocks $CRC32_0$ to $CRC32_3$ each being of one byte, as shown in FIG. 24(4), the arithmetic operation result blocks $CRC32_1$ and $CRC32_2$ being a first half of the arithmetic operation result CRC32 can be transmitted as the byte data $DB'_3$ by adding these two blocks $CRC32_1$ and $CRC32_2$ to the data blocks $BD_{12}$ and $BD_{13}$ to the arithmetic operation section 20 during the fifth period #5. On the other hand, in order to transmit the remaining arithmetic operation result blocks $CRC32_2$ and $CRC32_3$ being a latter half of the arithmetic operation result CRC32, as shown in FIG. 24(4), new byte data $BD_4$ has to be produced and to be then transmitted during the sixth period #6 to the arithmetic operation section 20. That is, at this point, since data transmission not associated directly with the CRC16 operation has to be carried out, additional time being equivalent to one clock is needed. Therefore, the latch 14, in order to adjust timing between the data transmission requiring the additional time being equivalent to one clock and the CRC16 operation in the arithmetic operation section 20, latches the output data $D_1$ from the data inputting section 11 during the time being equivalent to one clock.

Moreover, to perform the CRC operation, time being equivalent to at least one clock is necessary and therefore the latches 15 and 16 are mounted at a latter stage of each of the arithmetic operation sections 19 and 20. As a result, a time delay being equivalent to two clocks occurs between inputting of the input data $D_0$ to the data inputting section 11 and outputting of the output data $D_8$ from the data outputting section 21. To solve this problem, in the conventional CRC arithmetic operation circuit, the latch 12 corresponding to the latch 14 is mounted and the latch 13 corresponding to the latches 15 and 16 is mounted between the data inputting section 11 and the selector 18.

Because of this, the conventional CRC arithmetic operation circuit has a problem in that it cannot meet requirements for high-speed signal processing in data communications induced by high-speed operations of CPUs (Central Processing Unit) in recent years. This inconvenience also occurs even in the case of data communications in which data is transmitted by performing the CRC operation a plurality of numbers of times. It is impossible to meet the requirement for high-speed signal processing in data communications only by increasing a data transmission speed and/or increasing a width of a bus and, therefore, an increase in the processing speed within a signal processing circuit is essential.

SUMMARY OF THE INVENTION

In view of the above, it is an object of the present invention to provide an arithmetic operation method for a cyclic redundancy check (CRC) and an arithmetic operation circuit for the CRC being capable of performing a high-speed arithmetic operation for the CRC.

According to a first aspect of the present invention, there is provided an arithmetic operation method for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation method including:

first arithmetic operation processing in which a first arithmetic operation is performed on the data by a specified number of bits using a first generative polynomial;

second arithmetic operation processing in which a second arithmetic operation is performed on the data by a specified number of bits using at least one piece of a second generative polynomial being same as or different from the first generative polynomial; and third arithmetic operation processing in which a third arithmetic operation is performed on the data of a specified number of bits and on at least one piece of an arithmetic operation result being obtained at a midpoint in either of the first arithmetic operation or the second arithmetic operation or in both the first arithmetic operation and the second arithmetic operation.

In the foregoing, a preferable mode is one wherein, in the third arithmetic operation processing, the third arithmetic operation is performed by handling the data of the specified number of bits as low-order bits and by handling at least one piece of the third arithmetic operation result as high-order bits.

According to a second aspect of the present invention, there is an arithmetic operation method for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation method including:

first arithmetic operation processing in which a first arithmetic operation is performed on the data by 32 bits using a 32nd order generative polynomial;

second arithmetic operation processing in which a second arithmetic operation is performed on the data by 32 bits using a 16th order generative polynomial; and third arithmetic operation processing in which a third arithmetic operation is performed on the data of 32 bits and on an arithmetic operation result of 32 bits being obtained at a midpoint in the first arithmetic operation processing using the 16th order generative polynomial.

In the foregoing, a preferable mode is one wherein, in the third arithmetic operation processing, the third arithmetic operation is performed by 64 bits in total by handling the data of 32 bits as low-order bits and the arithmetic operation result of 32 bits as high-order bits.

According to a third aspect of the present invention, there is provided an arithmetic operation method for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation method including:

first arithmetic operation processing in which a first arithmetic operation is performed on the data by 32 bits using a 16th order generative polynomial;

second arithmetic operation processing in which a second arithmetic operation is performed on the data by 32 bits using the 16th order generative polynomial;

third arithmetic operation processing in which a third arithmetic operation is performed on the data of 32 bits and on a first arithmetic operation result of 16 bits being obtained at a midpoint in the first arithmetic operation processing using the 16th order generative polynomial;

fourth arithmetic operation processing in which an arithmetic operation is performed on the data by 32 bits using the 16th order generative polynomial; and fifth arithmetic operation processing in which an arithmetic operation is performed on the data of 32 bits, the first arithmetic operation result of 16 bits, and a second arithmetic operation result of 16 bits being obtained at a midpoint in the second arithmetic operation processing using the 16th generative polynomial.

In the foregoing, a preferable mode is one wherein, in the third arithmetic operation processing, the third arithmetic operation is performed by 48 bits in total by handling the data of 32 bits as low-order bits and the first arithmetic operation result of 16 bits as high-order bits and wherein, in the fifth arithmetic operation processing, the fifth arithmetic operation is performed by 64 bits in total by handling the data of 32 bits as low-order bits, the first arithmetic operation result of 16 bits as middle-order bits, and the second arithmetic operation result of 16 bits as high-order bits.

According to a fourth aspect of the present invention, there is provided an arithmetic operation circuit for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation circuit including:

a first arithmetic operation section to perform a first arithmetic operation on the data by a specified number of bits using a first generative polynomial;

a second arithmetic operation section to perform a second arithmetic operation on the data by the specified number of bits using at least one piece of a second generative polynomial being same as or different from the first generative polynomial; and a third arithmetic operation section to perform a third arithmetic operation on the data of the specified number of bits and on at least one piece of an arithmetic operation result being obtained at a midpoint in either of the first arithmetic operation or the second arithmetic operation or in both the first arithmetic operation and the second arithmetic operation using at least one piece of the second generative polynomial.

In the foregoing, a preferable mode is one that wherein includes a data combining section to combine the data of the specified number of bits handled as low-order bits with at least one piece of the arithmetic operation result handled as high-order bits and to feed combined results to the third arithmetic operation section.

According to a fifth aspect of the present invention, there is provided an arithmetic operation circuit for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation circuit including:

a first arithmetic operation section to perform a first arithmetic operation on the data by 32 bits using a 32nd order generative polynomial;

a second arithmetic operation section to perform a second arithmetic operation on the data by 32 bits using a 16th order generative polynomial; and a third arithmetic operation section to perform a third arithmetic operation on the data of 32 bits and on an arithmetic operation result of 32 bits being obtained at a midpoint in the first arithmetic operation section using the 16th order generative polynomial.

In the foregoing, a preferable mode is one that wherein includes a data combining section to combine the data of 32 bits handled as low-order bits with the arithmetic operation result of 32 bits handled as high-order and to feed combined results to the third arithmetic operation section.

According to a sixth aspect of the present invention, there is provided an arithmetic operation circuit for a cyclic redundancy check which performs arithmetic operations for error detection on data to be transmitted using a plurality of generative polynomials and is used in a communications system in which transmission of the data is accomplished by adding a result from each of the arithmetic operations to the data, the arithmetic operation circuit including:

a first arithmetic operation section to perform a first arithmetic operation on the data by 32 bits using a 16th order generative polynomial;

a second arithmetic operation section to perform a second arithmetic operation on the data by 32 bits using the 16th order generative polynomial;

a third arithmetic operation section to perform a third arithmetic operation on the data of 32 bits and on a first arithmetic operation result of 16 bits being obtained at a midpoint in the first arithmetic operation section using the 16th order generative polynomial;

a fourth arithmetic operation section to perform a fourth arithmetic operation on the data by 32 bits using the 16th order generative polynomial; and a fifth arithmetic operation section to perform a fifth arithmetic operation on the data of 32 bits, the first arithmetic operation result, and a second arithmetic operation result of 16 bits being obtained at a midpoint in the second arithmetic operation section using the 16th generative polynomial.

In the foregoing, a preferable mode is one that wherein further includes:

a first data combining section to combine the data of 32 bits with the first arithmetic operation result and to feed a combined result to the third arithmetic operation section, wherein as the combined result, the data of 32 bits is placed at low-order bits and the first arithmetic operation result is placed at high-order bits, and a second data combining section to combine together the data of 32 bits, the first arithmetic operation result, and the second arithmetic operation result and to feed a combined result to the fifth arithmetic operation section, wherein as the combined result the data of 32 bits is placed at low-order bits and the first arithmetic operation result is placed at middle-order bits, and the second arithmetic operation result is placed at high-order bits.

With the above configuration, the arithmetic operation method for the CRC includes first arithmetic operation processing in which a first arithmetic operation is performed on data to be transmitted, by a specified number of bits, using a first generative polynomial, second arithmetic operation processing in which a second arithmetic operation is performed on data to be transmitted, by a specified number of bits, using at least one second generative polynomial being same as or being different from the first generative polynomial, and third arithmetic operation processing in which a third arithmetic operation is performed on data of a specified number of bits and on at least one arithmetic operation result of a specified number of bits being obtained at a midpoint in either of the first arithmetic operation or the second arithmetic operation or in both the first arithmetic operation and the second arithmetic operation using at least one second generative polynomial.

BRIEF DESCRIPTION OF THE DRAWINGS

The above and other objects, advantages, and features of the present invention will be more apparent from the following description taken in conjunction with the accompanying drawings in which:

FIG. 3 is a diagram showing operational expressions for a CRC16 operation to be implemented by an arithmetic operation section employed in the CRC arithmetic operation circuit according to the first embodiment of the present invention;

FIG. 4 is a diagram showing operational expressions obtained at a midpoint in acquiring the operational expressions of FIG. 3;

FIG. 5 is a timing chart explaining one example of operations of the CRC arithmetic operation circuit according to the first embodiment of the present invention;

FIG. 11 is a diagram showing operational expressions for a CRC16 operation to be implemented by an arithmetic operation section employed in the CRC arithmetic operation circuit according to the second embodiment of the present invention;

FIG. 12 is a diagram showing operational expressions obtained at a midpoint in acquiring the operational expressions of FIG. 11;

FIG. 13 is a diagram showing operational expressions for the CRC16 operation to be implemented by another arithmetic operation section employed in the CRC arithmetic operation circuit according to the second embodiment of the present invention;

FIG. 14 is a timing chart explaining one example of operations of the CRC arithmetic operation circuit according to the second embodiment of the present invention;

FIG. 20 is a diagram showing an operational expression for a CRC32 operation implemented by the arithmetic operation section in the conventional CRC arithmetic operation circuit;

FIG. 21 is also a diagram showing the operational expression for the CRC32 operation implemented by the arithmetic operation section in the conventional CRC arithmetic operation circuit;

FIG. 23 a diagram showing an operational expression for a CRC16 operation implemented by the arithmetic operation section in the conventional CRC arithmetic operation circuit; and FIG. 24 is a timing chart explaining one example of operations of the conventional CRC arithmetic operation circuit.

DETAILED DESCRIPTION OF THE PREFERRED EMBODIMENTS

Best modes of carrying out the present invention will be described in further detail using various embodiments with reference to the accompanying drawings.

First Embodiment

Figure 1:
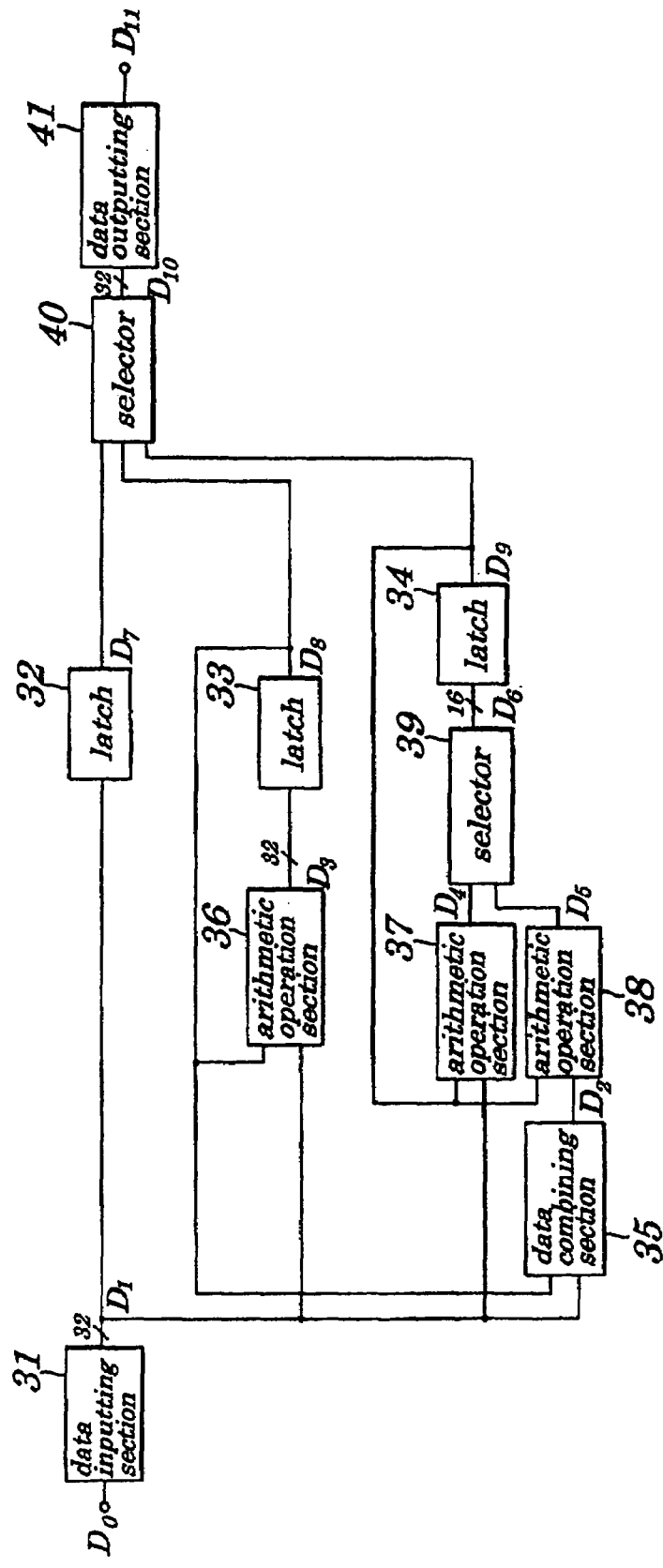
FIG. 1 is a block diagram showing configurations of a cyclic redundancy check (CRC) arithmetic operation circuit according to a first embodiment of the present invention.

FIG. 1 is a block diagram showing configurations of a CRC arithmetic operation circuit according to a first embodiment of the present invention. The CRC arithmetic operation circuit of the first embodiment includes a data inputting section 31, latches 32 to 34, a data combining section 35, arithmetic operation sections 36 to 38, selectors 39 and 40, and a data outputting section 41. The data inputting section 31 is an interface to perform waveform shaping on input data $D_0$ being input 32 bits by 32 bits and to input it as output data $D_1$ to circuit elements at a later stage. The latch 32 is made up of a 32-bit flip-flop (FF) and is mounted to adjust timing for data processing. The latch 32 latches the output data $D_1$ from the data inputting section 31 during a period of time being equivalent to one clock fed from an outside and outputs it as an output data $D_7$. The data combining section 35 combines the output data $D_1$ fed from the data inputting section 31 with output data $D_8$ from the latch 33 and outputs it as an output data $D_2$ made up of the output data $D_1$ fed from the data inputting section 35 being handled as low-order 32 bits and the output data $D_8$ from the latch 33 being handled as high-order 32 bits. The arithmetic operation section 36 performs a CRC32 operation on the output data $D_1$ fed from the data inputting section 31 by using the output data $D_8$ from the latch 33 and then outputs an arithmetic operation result of 32 bits as an output data $D_3$. The arithmetic operation section 37 performs a CRC16 operation on the output data $D_1$ fed from the data inputting section 31 by using an output data $D_9$ from the latch 34 and then outputs an arithmetic operation result of 16 bits as an output data $D_4$. The arithmetic operation section 38 performs the CRC16 operation on the output data $D_2$ fed from the data combining section 35 by using the output data $D_9$ from the latch 34 and then outputs an arithmetic operation result of 16 bits as output data $D_5$.

The selector 39 selects either of the output data $D_4$ from the arithmetic operation section 37 or the output data $D_5$ from the arithmetic operation section 38 and outputs it as an output data $D_6$. The latch 33 is made up of a 32-bit flip-flop (FF) and latches the output data $D_3$ from the arithmetic operation section 36 during a period of time being equivalent to one clock and then outputs it as the output data $D_8$. The latch 34 is made up of a 16-bit flip-flop (FF) and latches the output data $D_6$ from the selector 39 during a period of time being equivalent to one clock and then outputs it as the output data $D_9$. The selector 40 selects any one of the output data $D_7$ from the latch 32, output data $D_8$ from the latch 33 or output data $D_9$ from the latch 34 and outputs it as an output data $D_{10}$. The data outputting section 41 is an interface to perform waveform shaping on the output data $D_{10}$ from the selector 40 and to feed it as output data $D_{11}$ to circuit elements at a later stage.

The arithmetic operation section 36 is a circuit in which the operational expressions shown in FIGS. 20 and 21 have been implemented. The arithmetic operation section 37 is a circuit in which the operational expressions shown in FIG. 23 have been implemented. The arithmetic operation section 38 is a circuit in which the operational expressions shown in FIG. 3 have been implemented. In FIG. 3, each of Z15 to Z00 corresponds to each of initial values of flip-flops FF $27_{16}$ to FF $27_1$ shown in FIG. 22 and each of R31 to R00 corresponds to each bit contained in the output data $D_8$ fed from the latch 33. Each of D31 to D00 corresponds to each bit in the input data. The symbol "☐" shows that calculations are to be done in accordance with an exclusive OR operation.

Figure 2:
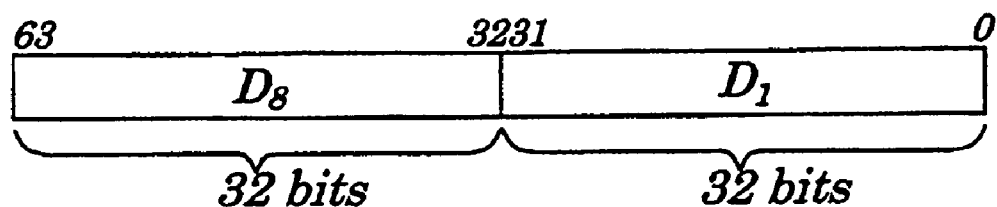
FIG. 2 is a diagram showing a data format for output data produced by a data combining section employed in the CRC arithmetic operation circuit according to the first embodiment of the present invention.

The operational expressions shown in FIG. 3 are produced by following procedures. As described above, to the arithmetic operation section 38 is input 64 bits of data shown in FIG. 2. Therefore, it is necessary to first perform the CRC16 operation on input data being of 64 bits in length. At this point, the arithmetic operation result CRC16 corresponds to each of the output data C15 to C00 output from each of the flip-flops FF $27_{16}$ to $27_1$ shown in FIG. 22 when a clock used to shift 64 bits of data is fed to the arithmetic operation section 20 in FIG. 22. FIG. 4 shows operational expressions to obtain each of output data C15 to C00 from each of the flip-flops FF $27_{16}$ to FF $27_1$ which are output when a clock used to shift 64 bits of data whose bit number is the same as that of input data of 64 bits is fed to the arithmetic operation section 38. In FIG. 4, each of R15 to R00 corresponds to each of initial values of flip-flops FF $27_{16}$ to FF $27_1$ shown in FIG. 22 and each of D63 to D00 corresponds to each bit in the input data. The symbol "☐" shows that calculations are to be done in accordance with the exclusive OR operation. As shown in FIG. 2, the high-order 32 bits out of the output data $D_2$ from the data combining section 35 are the output data $D_8$, that is, the arithmetic operation result CRC32 in the arithmetic operation section 36. Therefore, each of the operational expressions C31 to C00 shown in FIGS. 20 and 21 is substituted into each of the operational expressions D63 to D32 shown in FIG. 4. In this case, in order to distinguish the R15 to R00 shown in FIG. 4 from the R31 to R00 shown in FIGS. 20 and 21, the former are expressed as Z15 to Z00. By rearranging each of the obtained operational expressions based on the "modulo-two operation", the operational expression shown in FIG. 3 can be obtained.

Next, operations of the CRC arithmetic operation circuit of the first embodiment will be described by referring to a timing chart shown in FIG. 5. First, to simplify the description, let it be assumed that the input data $D_0$ is made up of byte data $BD_0$ to $BD_3$, as shown in FIG. 5. The byte data $BD_0$ includes data blocks $DB_0$ to $DB_3$ each being of one byte. The byte data $BD_1$ includes data blocks $DB_4$ to $DB_7$ each being of one byte. The byte data $BD_2$ includes data blocks $DB_8$ to $DB_{11}$ each being of one byte. The byte data $BD_3$ includes data blocks $DB_{12}$ and $DB_{13}$ each being of one byte. First, when the input data $D_0$ is sequentially fed from an outside, starting from the first period #1, in synchronization with a clock (not shown), to the CRC arithmetic operation circuit as shown in FIG. 5(1), the data inputting section 31 performs waveform shaping on the input data $D_0$ and feeds it as the output data $D_1$ sequentially to the latch 32, data combining section 35, and arithmetic operation sections 36 and 37.

Then, the latch 32 latches the output data $D_1$ fed from the data inputting section 31 during a period of time being equivalent to one clock fed from the outside and outputs it sequentially as the output data $D_7$, starting from a second period #2.

Moreover, the arithmetic operation section 36, during the first period #1, performs the CRC32 operation on the output data $D_1$ fed from the data inputting section 31, that is, on the byte data $BD_0$ in the example, by using the output data $D_8$ from the latch 33, that is, the initial value of the latch 33 in the example and produces an arithmetic operation result $CR_{00}$ and outputs it as the output data $D_3$. In the latch 33, "0" is set as its initial value, in advance. Therefore, the latch 33 latches the output data $D_3$ from the arithmetic operation section 36, that is, the arithmetic operation result $CR_{00}$ in the example during a period of time being equivalent to one clock and, as shown in FIG. 5(2), outputs it as the output data $D_8$ during the second period #2.

Next, the arithmetic operation section 36, during the second period #2, performs the CRC32 operation on the output data $D_1$ fed from the data inputting section 31, that is, on the byte data $BD_1$ in the example, by using the output data $D_8$ from the latch 33, that is, the arithmetic operation result $CR_{00}$ in the example and produces an arithmetic operation result $CR_{01}$ and outputs it as the output data $D_3$. Therefore, the latch 33 latches the output data $D_3$ from the arithmetic operation section 36, that is, the arithmetic operation result $CR_{01}$ in the example during a period of time being equivalent to one clock and, as shown in FIG. 5(2), outputs it as the output data $D_8$ during a third period #3.

Similarly, the arithmetic operation section 36, during the third period #3, performs the CRC32 operation on the output data $D_1$ fed from the data inputting section 31, that is, on the byte data $BD_2$ in the example, by using the output data $D_8$ from the latch 33, that is, the arithmetic operation result $CR_{01}$ in the example and produces an arithmetic operation result $CR_{02}$ and outputs it as the output data $D_3$. Therefore, the latch 33 latches the output data $D_3$ from the arithmetic operation section 36, that is, the arithmetic operation result $CR_{02}$ in the example during a period of time being equivalent to one clock and, as shown in FIG. 5(2), outputs it as the output data $D_8$ during a fourth period #4. Next, the arithmetic operation section 36, during the fourth period #4, performs the CRC32 operation on the output data $D_1$ fed from the data inputting section 31, that is, on the byte data $BD_3$ in the example, by using the output data $D_8$ from the latch 33, that is, the arithmetic operation result $CR_{02}$ in the example and produces an arithmetic operation result $CR_{03}$ and outputs it as the output data $D_3$. Therefore, the latch 33 latches the output data $D_3$ from the arithmetic operation section 36, that is, the arithmetic operation result $CR_{03}$ in the example during a period of time being equivalent to one clock and, as shown in FIG. 5(2), outputs it as the output data $D_8$ during the fifth period #5. The arithmetic operation result $CR_{03}$ becomes the arithmetic operation result CRC32. The arithmetic operation result CRC32 is made up of four pieces of arithmetic operation results $CRC32_0$ to $CRC32_3$.

On the other hand, the arithmetic operation section 37, during the first period #1, performs the CRC16 operation on the output data $D_1$ fed from the data inputting section 31, that is, on the byte data $BD_0$ in the example, by using the output data $D_9$ from the latch 34, that is, the initial value of the latch 34 in the example and produces an arithmetic operation result $CR_{10}$ and, as shown in FIG. 5(3), outputs it as the output data $D_4$. In the latch 34, "0" is set in advance as its initial value. The selector 39, during the first period #1, selects the output data $D_4$ output from the arithmetic operation section 37, that is, the arithmetic operation result $CR_{10}$ in the example and outputs it as the output data $D_6$. Therefore, the latch 34 latches the output data $D_6$ from the selector 39, that is, the arithmetic operation result $CR_{10}$ in the example during a period of time being equivalent to one clock and, as shown in FIG. 5(5), outputs it as the output data $D_9$ during the second period #2. Next, the arithmetic operation section 37, during the second period #2, performs the CRC16 operation on the output data $D_1$ fed from the data inputting section 31, that is, on the byte data $BD_1$ in the example, by using the output data $D_9$ from the latch 34, that is, the arithmetic operation result $CR_{10}$ in the example and produces an arithmetic operation result $CR_{11}$ and, as shown in FIG. 5(3), outputs it as the output data $D_4$. The selector 39, during the second period #2, selects the output data $D_4$ output from the arithmetic operation section 37, that is, the arithmetic operation result $CR_{11}$ in the example and outputs it as the output data $D_6$. Therefore, the latch 34 latches the output data $D_6$ from the selector 39, that is, the arithmetic operation result $CR_{11}$ in the example during a period of time being equivalent to one clock and, as shown in FIG. 5(5), outputs it as the output data $D_9$ during the third period #3.

Similarly, the arithmetic operation section 37, during the third period #3, performs the CRC16 operation on the output data $D_1$ fed from the data inputting section 31, that is, on the byte data $BD_2$ in the example, by using the output data $D_9$ from the latch 34, that is, the arithmetic operation result $CR_{11}$ in the example and produces an arithmetic operation result $CR_{12}$ and, as shown in FIG. 5(3), outputs it as the output data $D_4$. The selector 39, during the third period #3, selects the output data $D_4$ output from the arithmetic operation section 37, that is, the arithmetic operation result $CR_{12}$ in the example and outputs it as the output data $D_6$. Therefore, the latch 34 latches the output data $D_6$ from the selector 39, that is, the arithmetic operation result $CR_{12}$ in the example during a period of time being equivalent to one clock and, as shown in FIG. 5(5), outputs it as the output data $D_9$ during the fourth period #4.

Next, when the fourth period #4 starts, that is, when the byte data $BD_3$ being last data making up the input data $D_0$ is detected, following processing is performed.

First, the data combining section 35 combines the output data $D_1$ fed from the data inputting section 31, that is, the byte data $BD_3$ in the example, with the output data $D_8$ fed from the latch 33, that is, the arithmetic operation result $CR_{02}$ in the example to produce the output data $D_2$ of 64 bits in total containing the output data $D_1$ fed from the data inputting section 31 to be handled as low-order 32 bits and the output data $D_8$ fed from the latch 33 as high-order 32 bits in the same manner as in FIG. 2 and outputs it. Then, the arithmetic operation section 38 performs the CRC16 operation on the output data $D_2$ of 64 bits by using the output data $D_9$ fed from the latch 34, that is, the arithmetic operation result $CR_{12}$ in the example and produces an arithmetic operation result $CR_{13}$ and, as shown in FIG. 5(4), outputs it as the output data $D_5$. This arithmetic operation result $CR_{13}$ becomes the arithmetic operation result CRC16. The arithmetic operation result CRC16, as described above, is made up of two the arithmetic operation result blocks $CRC16_0$ and $CRC16_1$. The selector 39, during the fourth period #4, now selects the output data $D_5$ output from the arithmetic operation section 38, that is, the arithmetic operation result $CR_{13}$ in the example and outputs it as the output data $D_6$. Therefore, the latch 34 latches the output data $D_6$ from the selector 39, that is, the arithmetic operation result $CR_{13}$ in the example during a period of time being equivalent to one clock and, as shown in FIG. 5(5), outputs it as the output data $D_9$ during the fifth period #5.

The selector 40, during the second period #2 to the fourth period #4, selects the output data $D_7$ of 32 bits output from the latch 32, that is, any one of the byte data $BD_0$ to $BD_2$ and outputs it as the output data $D_{10}$. Moreover, the selector 40, during the fifth period #5, combines the output data $D_7$ from the latch 32, that is, the data blocks $DB_{12}$ and $DB_{13}$ in the example and the output data $D_8$ from the latch 33, that is, arithmetic operation blocks $CRC32_0$ and $CRC32_1$ in the example into new byte data $BD'_3$ and outputs it as the output data $D_{10}$. Furthermore, the selector 40, during the sixth period #6, combines the output data $D_8$ from the latch 33, that is, the arithmetic operation result blocks $CRC32_2$ and $CRC32_3$ making up the arithmetic operation result CRC32 in the example and the output data $D_9$ from the latch 34, that is, the arithmetic operation result blocks $CRC16_0$ and $CRC16_1$ making up the arithmetic operation result CRC16 in the example into new byte data $BD_4$ and outputs it as the output data $D_{10}$. Therefore, the data outputting section 41, as shown in FIG. 5(6), performs waveform shaping on the output data $D_{10}$ of 32 bits output from the selector 40 and feeds it as the output data $D_{11}$ to circuit elements at a later stage.

Thus, by using the data combining section 35, the byte data $BD_3$ being last data of the output data $D_1$ is combined with the arithmetic operation result $CR_{12}$ existing by one data before a final arithmetic operation result CRC32 is obtained in the arithmetic operation section 36 to produce 64 bits of output data $D_2$. In the arithmetic operation section 38, the CRC16 operation is performed on the output data $D_2$ of 64 bits to obtain the arithmetic operation result CRC16. This enables the arithmetic operation results CRC32 and CRC16 to be acquired simultaneously.

Therefore, according to the configuration of the CRC arithmetic operation circuit of the first embodiment, unlike in the case of the conventional CRC arithmetic operation circuit in which the CRC16 operation is performed after the acquirement of the arithmetic operation result CRC32 by the CRC32 operation, a delay occurring between inputting of input data $D_0$ to the data inputting section 31 and outputting of output data $D_{11}$ from the data outputting section 41 can be reduced by a period of time being equivalent to one clock. Thus, the CRC arithmetic operation circuit of the first embodiment of the present invention can meet requirements for high-speed signal processing in data communications by high-speed operations of CPUs in recent years.

Second Embodiment

Figure 6:
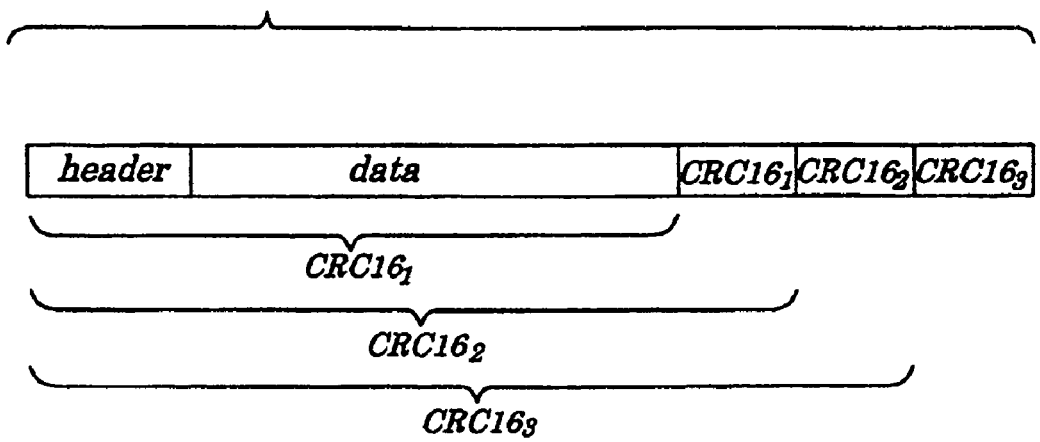
FIG. 6 is a diagram illustrating one example of a data format for communications data to be transmitted in a communications system to which a CRC arithmetic operation circuit of a second embodiment of the present invention is applied.
Figure 7:
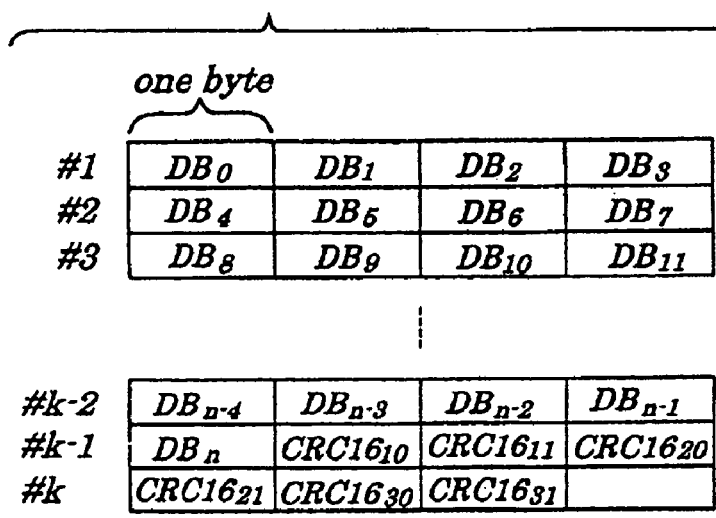
FIG. 7 is a diagram illustrating a state of transmission of communications data in the CRC arithmetic operation circuit according to the second embodiment of the present invention.

As a precondition, let it be assumed that, in the second embodiment, data is incorporated into communications data configured in a data format shown in FIG. 6 and is transmitted by four bytes (32 bits) by a high-speed protocol described above. The communications data, as shown in FIG. 6, is made up of a header, data, and arithmetic operation results $CRC16_1$ to $CRC16_3$. As shown in FIG. 7, the header and data included in the communications data are divided into "n" (n is a natural number) pieces of data blocks $DB_0$ to $DB_{n-1}$ each being of one byte and the arithmetic operation results $CRC16_1$ in the communications data are divided into two pieces of arithmetic operation result blocks $CRC16_{10}$ and $CRC16_{11}$. Moreover, the arithmetic operation result $CRC16_2$ is divided into two pieces of arithmetic operation result blocks $CRC16_{20}$ to $CRC16_{21}$ and the arithmetic operation result $CRC16_3$ is divided into two pieces of arithmetic operation result blocks $CRC16_{30}$ and $CRC16_{31}$. Then, a $CRC16_1$ operation is performed on the header and the data. A $CRC16_2$ operation is performed on the header, the data, and the arithmetic operation result $CRC16_1$. A $CRC16_3$ operation is performed on the header, the data, and the arithmetic operation results $CRC16_1$ and $CRC16_2$. That is, in the $CRC16_2$ operation, the arithmetic operation result $CRC16_1$, the header, and the data are considered to be alike. In the $CRC16_3$ operation, the arithmetic operation results $CRC16_1$ and $CRC16_2$, the header, and the data are considered to be alike.

Figure 8:
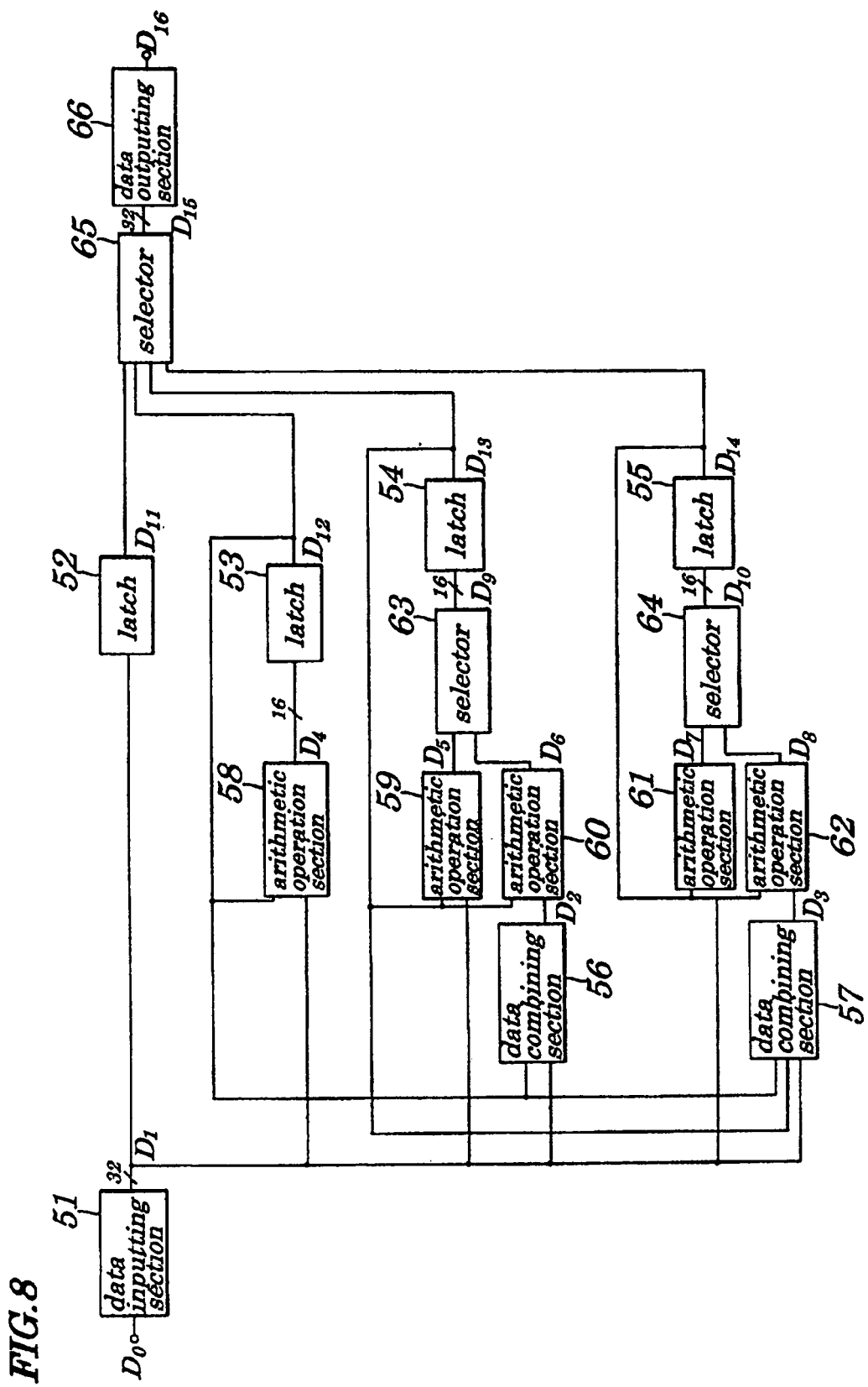
FIG. 8 is a block diagram showing configurations of the CRC arithmetic operation circuit according to the second embodiment of the present invention.
Figure 9:
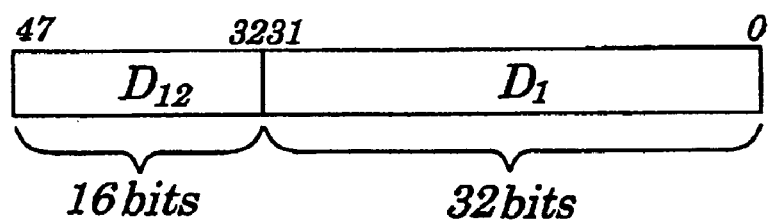
FIG. 9 is a diagram illustrating a data format for output data produced by a data combining section making up the CRC arithmetic operation circuit according to the second embodiment of the present invention.
Figure 10:
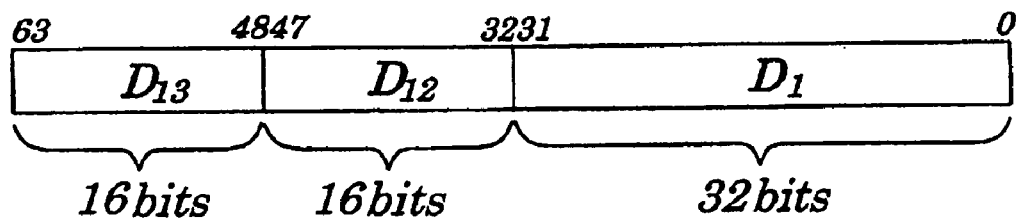
FIG. 10 is a diagram illustrating a data format for output data produced by another data combining section making up the CRC arithmetic operation circuit according to the second embodiment of the present invention.
Figure 15:
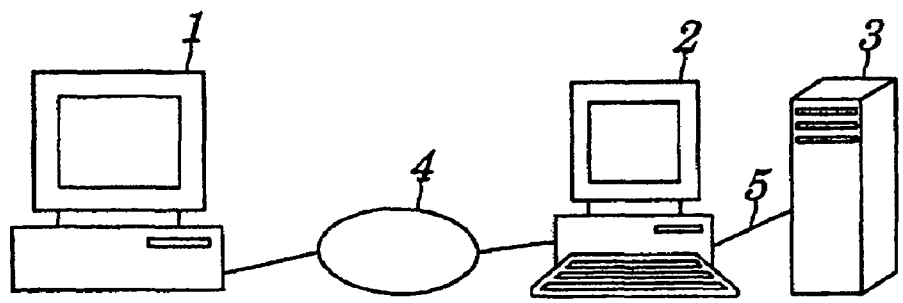
FIG. 15 is a schematic block diagram showing an example of configurations of a conventional data communications system.
Figure 16:
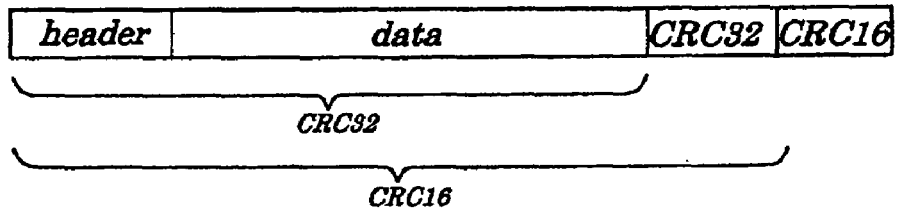
FIG. 16 is a diagram illustrating one example of a data format for communications data transmitted by the conventional data communication system.
Figure 17:
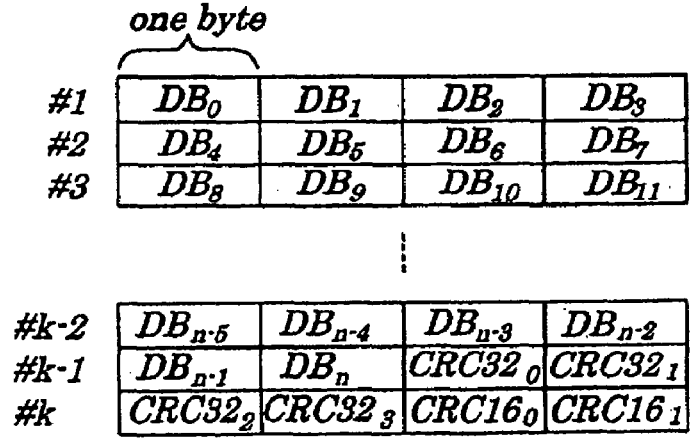
FIG. 17 is a diagram illustrating a state of transmission of the communications data in the conventional data communication system.
Figure 18:
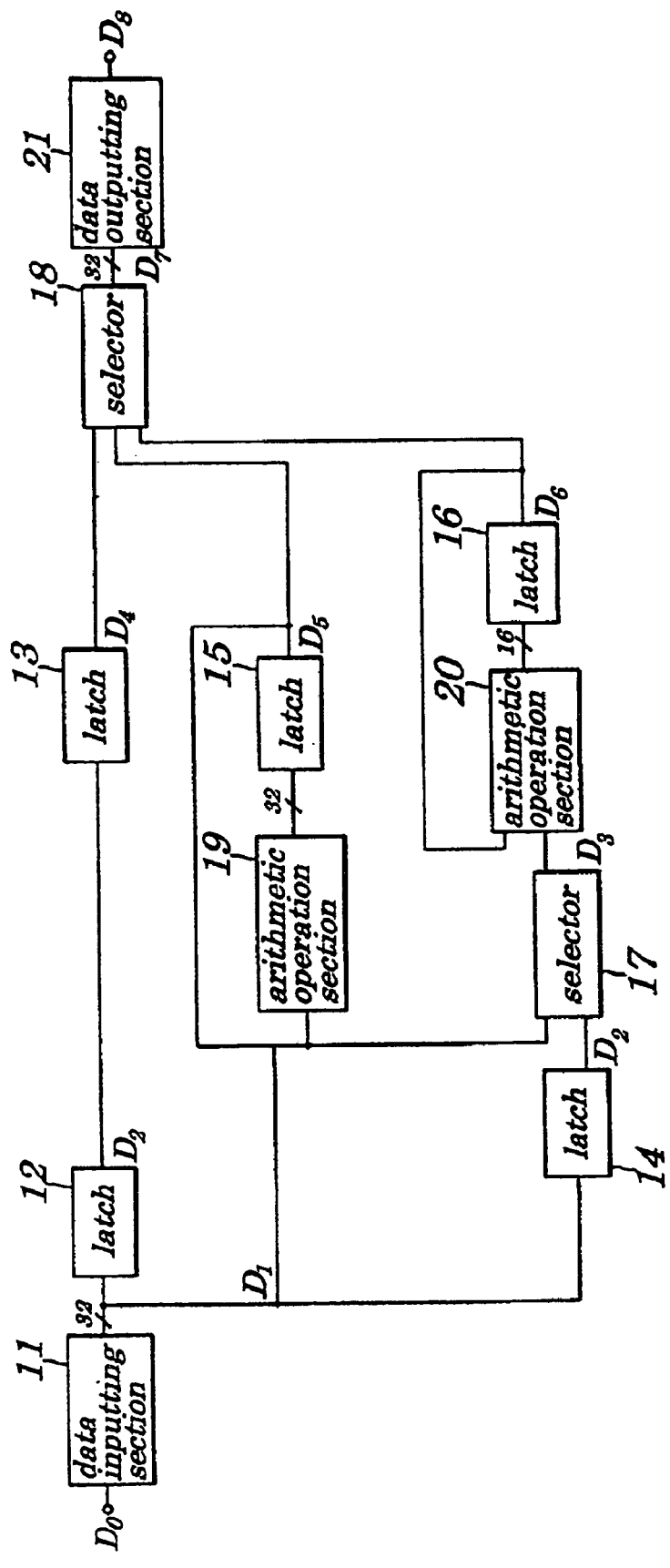
FIG. 18 is a block diagram showing configurations of a conventional CRC arithmetic operation circuit.
Figure 19:
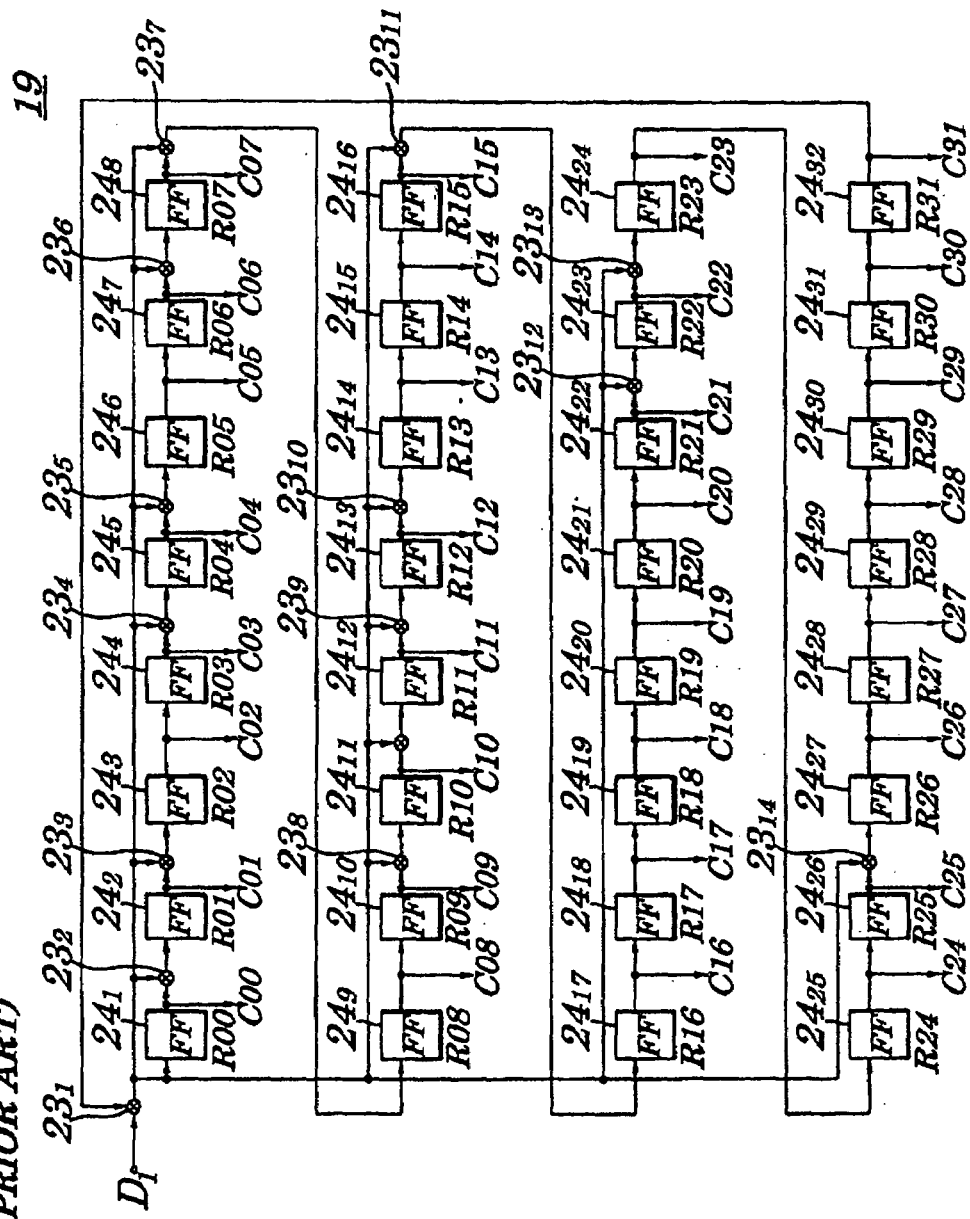
FIG. 19 is a block diagram showing configurations of an arithmetic operation section making up the conventional CRC arithmetic operation circuit.

FIG. 8 is a block diagram showing configurations of a CRC arithmetic operation circuit according to the second embodiment of the present invention. The CRC arithmetic operation circuit of the second embodiment includes a data inputting section 51, latches 52 to 55, data combining sections 56 and 57, arithmetic operation sections 58 to 62, selectors 63 to 65, and data outputting section 66. The data inputting section 51 is an interface to perform waveform shaping on input data $D_0$ being input by 32 bits and to input it as output data $D_1$ to circuit elements at a later stage. The latch 52 is made up of a 32-bit flip-flop and is mounted to adjust timing for data processing. The latch 52 latches the output data $D_1$ from the data inputting section 51 during a period of time being equivalent to one clock being fed from an outside and outputs it as output data $D_{11}$. The data combining section 56 combines the output data $D_1$ fed from the data inputting section 51 with an output data $D_{12}$ from the latch 53 and, as shown in FIG. 9, outputs it as the output data $D_2$ made up of the output data $D_1$ fed from the data inputting section 51 being handled as low-order 32 bits and of the output data $D_{12}$ from the latch 53 being handled as high-order 16 bits. The data combining section 57 combines the output data $D_1$ fed from the data inputting section 51 with the output data $D_{12}$ from the latch 53 and, as shown in FIG. 10, outputs it as the output data $D_3$ made up of the output data $D_1$ fed from the data inputting section 51 being handled as low-order 32 bits and of the output data $D_{12}$ from the latch 53 being handled as middle-order 16 bits and of an output data $D_{13}$ from the latch 54 being handled also as low-order 16 bits. The arithmetic operation section 58 performs the CRC16 operation on the output data $D_1$ fed from the data inputting section 51 by using the output data $D_{12}$ from the latch 53 and outputs arithmetic operation result of 16 bits as the output data $D_4$. The arithmetic operation section 59 performs the CRC16 operation on the output data $D_1$ fed from the data inputting section 51 by using the output data $D_{13}$ from the latch 54 and outputs arithmetic operation result of 16 bits as the output data $D_5$. The arithmetic operation section 60 performs the CRC16 operation on the output data $D_2$ fed from the data combining section 56 by using the output data $D_{13}$ from the latch 54 and outputs arithmetic operation result of 16 bits as the output data $D_6$. The arithmetic operation section 61 performs the CRC16 operation on the output data $D_1$ fed from the data inputting section 51 by using the output data $D_{14}$ from the latch 55 and outputs arithmetic operation result of 16 bits as the output data $D_7$. The arithmetic operation section 62 performs the CRC16 operation on the output data $D_3$ fed from the data combining section 57 by using the output data $D_{14}$ from the latch 55 and outputs arithmetic operation result of 16 bits as the output data $D_8$.

The selector 63 selects either of the output data $D_5$ output from the arithmetic operation section 59 or output data $D_6$ output from the arithmetic operation section 60 and outputs it as the output data $D_9$. The selector 64 selects either of the output data $D_7$ output from the arithmetic operation section 61 or output data $D_8$ output from the arithmetic operation section 62 and outputs it as the output data $D_{10}$. The latch 53 is made up of a 16-bit flip-flop and latches the output data $D_4$ output from the arithmetic operation section 58 during a period of time being equivalent to one clock and outputs it as the output data $D_{12}$. The latch 54 is made up of a 16-bit flip-flop and latches the output data $D_9$ from the selector 63 during a period of time being equivalent to one clock and outputs it as the output data $D_{13}$. The latch 55 is made up of a 16-bit flip-flop and latches the output data $D_{10}$ from the selector 64 during a period of time being equivalent to one clock and outputs it as the output data $D_{14}$. The selector 65 selects any one of the output data $D_{11}$ output from the latch 52, output data $D_{12}$ output from the latch 53, output data $D_{13}$ output from the latch 54, or output data $D_{14}$ output from the latch 55 and outputs the selected output data as an output data $D_{15}$. The data outputting section 66 is an interface to perform waveform shaping on the output data $D_{15}$ from the selector 65 and to feed it as an output data $D_{16}$ to circuit elements at a later stage.

The arithmetic operation sections 58, 59, and 61 are circuits in which the operational expressions shown in FIG. 23 have been implemented. The arithmetic operation section 60 is a circuit in which the operational expressions shown in FIG. 11 have been implemented. In FIG. 11, each of Z15 to Z00 corresponds to each of initial values for flip-flops FF $27_{16}$ to FF $27_1$ shown in FIG. 22 and each of R31 to R00 corresponds to each bit contained in the output data $D_{12}$ fed from the latch 53. Each of the D31 to D00 corresponds to each bit of the input data and the symbol "□" denotes the exclusive OR operation.

The operational expressions shown in FIG. 11 are produced by following procedures. As described above, to the arithmetic operation section 60 is input 48 bits of data shown in FIG. 9. Therefore, it is necessary to perform the CRC16 operation on input data having 48 bits in length. At this point, the arithmetic operation result CRC16 corresponds to each of the output data C15 to C00 output from each of the flip-flops FF $27_{16}$ to $27_1$ shown in FIG. 22 when a clock used to shift 48 bits of data is fed to the arithmetic operation section 20 in FIG. 22. FIG. 12 shows operational expressions to obtain each of output data C15 to C00 from each of the flip-flops FF $27_{16}$ to FF $27_1$ which are output when a clock used to shift 48 bits of data is fed to the arithmetic operation section 60. In FIG. 12, each of Z15 to Z00 corresponds to each of initial values for flip-flops FF $27_{16}$ to FF $27_1$ shown in FIG. 22 and each of D47 to D00 corresponds to each of the bit strings $d_{47}$, $d_{46}$, ..., $d_1$, $d_0$ making up the input data and the symbol "□" denotes the exclusive OR operation. As shown in FIG. 9, the high-order 16 bits out of the output data $D_2$ from the data combining section 56 are the output data $D_{12}$ output from the latch 53, that is, the arithmetic operation result $CRC16_1$ in the arithmetic operation section 58. Therefore, each of the operational expressions C15 to C00 shown in FIG. 23 is substituted into each of the operational expressions D47 to D32 shown in FIG. 12. By rearranging each of the obtained operational expressions based on the "modulo-two operation", the operational expression shown in FIG. 11 can be obtained.

Figure 22:
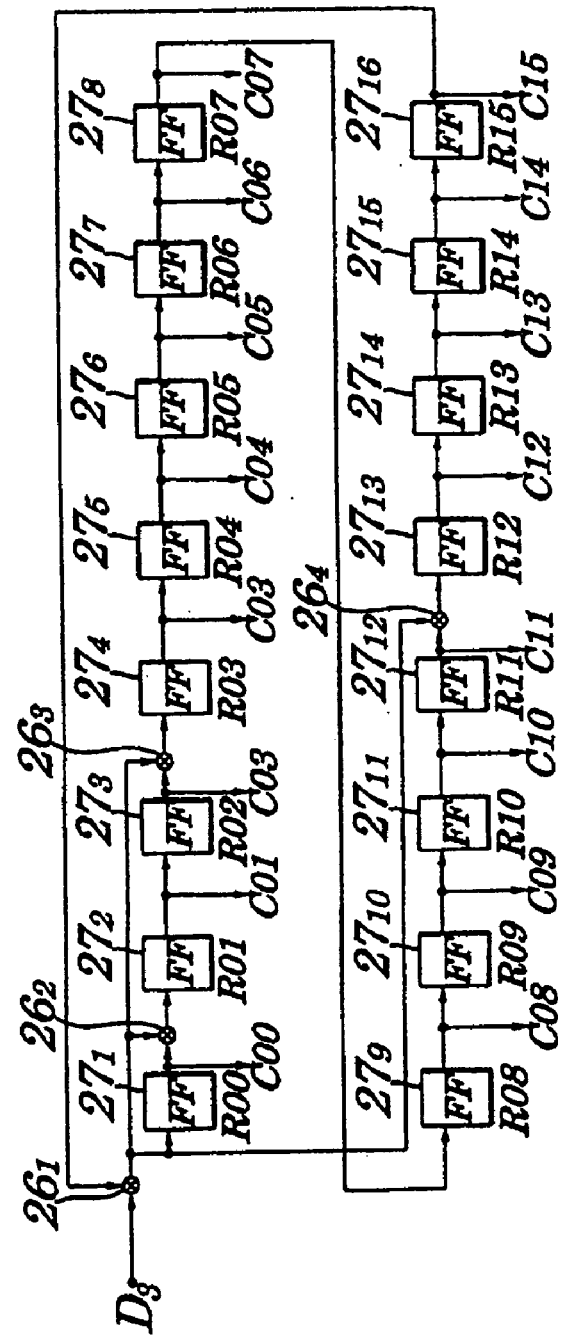
FIG. 22 is a block diagram showing configurations of the arithmetic operation section in the conventional CRC arithmetic operation circuit.

Moreover, although the arithmetic operation section 62 has the same configurations as those shown in FIG. 22, operational expressing shown in FIG. 13 is used. In FIG. 13, each of R15 to R00 corresponds to each of initial values for flip-flops FF $27_{16}$ to FF $27_1$ shown in FIG. 22 and each of X15 to X00 corresponds to each bit contained in the output data $D_{12}$ fed from the latch 53. Each of the Z15 to Z00 corresponds to each bit of the output data $D_{13}$ fed from the latch 53. Moreover, each of D31 to D00 corresponds to each of the bit strings $d_{31}$, $d_{30}$, ..., $d_1$, $d_0$ making up the above input data and the symbol "□" denotes the exclusive OR operation.

The operational expressions shown in FIG. 13 are produced by following procedures. As described above, to the arithmetic operation section 62 is input 64 bits of data shown in FIG. 10. Therefore, it is necessary to first perform the CRC16 operation on input data having 64 bits in length. At this point, the arithmetic operation result CRC16 corresponds to each of the output data C15 to C00 output from each of the flip-flops FF $27_{16}$ to $27_1$ shown in FIG. 22 when a clock used to shift 64 bits of data is fed to the arithmetic operation section 20 in FIG. 22. FIG. 4 shows operational expressions to obtain each of output data C15 to C00 from each of the flip-flops FF $27_{16}$ to FF $27_1$ which are output when a clock used to shift 64 bits of data whose number of bits are equal to the input data of 64 bits is fed to the arithmetic operation section 38. As shown in FIG. 10, the high-order 16 bits out of the output data $D_3$ from the data combining section 57 are the output data $D_{13}$ output from the latch 54, that is, the arithmetic operation result $CRC16_2$ in the arithmetic operation section 60 and middle-order 16 bits are the output data $D_{12}$ from the latch 53, that is, the arithmetic operation result $CRC16_1$ from the arithmetic operation section 58. Therefore, each of the operational expressions C15 to C00 shown in FIG. 11 is substituted into each of the operational expressions D63 to D48 shown in FIG. 4. Each of the operational expressions C15 to C00 shown in FIG. 23 is substituted into each of the operational expressions D47 to D32 shown in FIG. 4. In this case, in order to distinguish R15 to R00 shown in FIG. 4 from R15 to R00 shown in FIGS. 11 and 23, the latter are expressed by X15 to X00. By rearranging each of the obtained operational expressions based on the "modulo-two operation", the operational expression shown in FIG. 13 can be obtained.

Next, operations of the CRC arithmetic operation circuit having configurations described above will be explained by referring to a timing chart shown in FIG. 14. First, to simplify the description, as shown in FIG. 14, let it be assumed that the input data $D_0$ is made up of byte data $BD_0$ to $BD_3$. The byte data $BD_0$ is made up of data blocks $DB_0$ to $DB_3$ each being of one byte. The byte data $BD_1$ is made up of data blocks $DB_4$ to $DB_7$ each being of one byte. Moreover, the byte data $BD_2$ is made up of data blocks $DB_8$ to $DB_{11}$ being of one byte. The byte data $BD_3$ is made up of data block $DB_{12}$ being of one byte.

First, as shown in FIG. 14(1), when the input data $D_0$ is sequentially fed from an outside to the CRC arithmetic operation circuit in synchronization with a clock, starting from the first period #1, the data inputting section 51 performs waveform shaping on the input data $D_0$ and feeds it as the output data $D_1$ to the latch 52, the data combining sections 56 and 57, arithmetic operation sections 58, 59, and 61 sequentially.

The latch 52 latches the output data $D_1$ fed from the data inputting section 51 during a period of time being equivalent to one clock fed from an outside and outputs sequentially it as the output data $D_{11}$ starting from the second period #2.

Moreover, the arithmetic operation section 58, during the first period #1, performs the CRC16 operation on the output data $D_1$ fed from the data inputting section 51, that is, on the byte data $BD_0$ in the example, by using the output data $D_{12}$ from the latch 53, that is, the initial value of the latch 53 in the example and produces an arithmetic operation result $CR_{00}$ and outputs it as the output data $D_4$ as shown in FIG. 14(2). In the latch 53, "0" is set in advance as its initial value. Therefore, the latch 53 latches the output data $D_4$ output from the arithmetic operation section 58, that is, the arithmetic operation result $CR_{00}$ in the example during a period of time being equivalent to one clock and, as shown in FIG. 14(3), outputs it as the output data $D_{12}$ during the second period #2. Next, the arithmetic operation section 58, during the second period #2, performs the CRC16 operation on the output data $D_1$ fed from the data inputting section 51, that is, on the byte data $BD_1$ in the example, by using the output data $D_{12}$ from the latch 53, that is, the arithmetic operation result $CR_{00}$ in the example and produces an arithmetic operation result $CR_{01}$ and outputs it as the output data $D_4$ as shown in FIG. 14(2). Therefore, the latch 53 latches the output data $D_4$ output from the arithmetic operation section 58, that is, the arithmetic operation result $CR_{01}$ in the example during a period of time being equivalent to one clock and, as shown in FIG. 14(3), outputs it as the output data $D_{12}$ during the third period #3.

Similarly, the arithmetic operation section 58, during the third period #3, performs the CRC16 operation on the output data $D_1$ fed from the data inputting section 51, that is, on the byte data $BD_2$ in the example, by using the output data $D_{12}$ from the latch 53, that is, the arithmetic operation result $CR_{01}$ in the example and produces an arithmetic operation result $CR_{02}$ and outputs it as the output data $D_4$ as shown in FIG. 14(2). Therefore, the latch 53 latches the output data $D_4$ output from the arithmetic operation section 58, that is, the arithmetic operation result $CR_{02}$ in the example during a period of time being equivalent to one clock and, as shown in FIG. 14(3), outputs it as the output data $D_8$ during the fourth period #4. Next, the arithmetic operation section 58, during the fourth period #4, performs the CRC16 operation on the output data $D_1$ fed from the data inputting section 51, that is, on the byte data $BD_3$ in the example, by using the output data $D_{12}$ from the latch 53, that is, the arithmetic operation result $CR_{02}$ in the example and produces an arithmetic operation result $CR_{03}$ and outputs it as the output data $D_4$ as shown in FIG. 14(2). Therefore, the latch 53 latches the output data $D_4$ output from the arithmetic operation section 58, that is, the arithmetic operation result $CR_{03}$ in the example during a period of time being equivalent to one clock and, as shown in FIG. 14(3), outputs it as the output data $D_{12}$ during the fifth period #5. This arithmetic operation result $CR_{03}$ is the arithmetic operation result CRC16$_1$. This arithmetic operation result CRC16$_1$, as described above, is made up of two pieces of the arithmetic operation result blocks CRC16$_{10}$ and CRC16$_{11}$.

Moreover, the arithmetic operation section 61, during the first period #1, performs the CRC16 operation on the output data $D_1$ fed from the data inputting section 51, that is, on the byte data $BD_0$ in the example, by using the output data $D_{14}$ from the latch 55, that is, the initial value of the latch 55 and produces an arithmetic operation result $CR_{20}$ and outputs it as the output data $D_7$ as shown in FIG. 14(7). In the latch 55, "0" is set in advance as its initial value. The selector 64, during the first period #1, selects the output data $D_7$ output from the arithmetic operation section 61, that is, the arithmetic operation result $CR_{20}$ and outputs it as the output data $D_{10}$. Therefore, the latch 55 latches the output data $D_{10}$ output from the selector 64, that is, the arithmetic operation result $CR_{20}$ in the example during a period of time being equivalent to one clock and, as shown in FIG. 14(9), outputs it as the output data $D_{14}$ during the second period #2. Next, the arithmetic operation section 61, during the second period #2, performs the CRC16 operation on the output data $D_1$ fed from the data inputting section 51, that is, on the byte data $BD_1$ in the example, by using the output data $D_{14}$ from the latch 55, that is, the arithmetic operation result $CR_{20}$ and produces an arithmetic operation result $CR_{21}$ and, as shown in FIG. 14(7), outputs it as the output data $D_7$. The selector 64, during the second period #2, selects the output data $D_7$ output from the arithmetic operation section 61, that is, the arithmetic operation result $CR_{21}$ and outputs it as the output data $D_{10}$. Therefore, the latch 55 latches the output data $D_{10}$ output from the selector 64, that is, the arithmetic operation result $CR_{21}$ in the example during a period of time being equivalent to one clock and, as shown in FIG. 14(9), outputs it as the output data $D_{14}$ during the third period #3.

Similarly, the arithmetic operation section 61, during the third period #3, performs the CRC16 operation on the output data $D_1$ fed from the data inputting section 51, that is, on the byte data $BD_2$ in the example, by using the output data $D_{14}$ from the latch 55, that is, the arithmetic operation result $CR_{21}$ and produces an arithmetic operation result $CR_{22}$ and, as shown in FIG. 14(7), outputs it as the output data $D_7$. The selector 64, during the third period #3, selects the output data $D_7$ output from the arithmetic operation section 61, that is, the arithmetic operation result $CR_{22}$ and outputs it as the output data $D_{10}$. Therefore, the latch 55 latches the output data $D_{10}$ output from the selector 64, that is, the arithmetic operation result $CR_{22}$ in the example during a period of time being equivalent to one clock and, as shown in FIG. 14(9), outputs it as the output data $D_{14}$ during the fourth period #4.

Next, when the fourth period #4 starts, that is, when byte data $BD_3$ being last data making up the input data $D_0$ is detected, following processing is performed.

First, the data combining section 57 combines the output data $D_1$ fed from the data inputting section 51, that is, the byte data $BD_3$ in the example and output data $D_{12}$ output from the latch 53, that is, the arithmetic operation result $CR_{02}$ with the output data $D_{13}$ fed from the latch 54, that is, the arithmetic operation result $CR_{12}$ in the example and produces the output data $D_3$ of 64 bits in total containing the output data $D_1$ fed from the data inputting section 51 being handled as low-order 32 bits and the output data $D_{12}$ from the latch 53 being handled as middle-order 16 bits and the output data $D_{13}$ fed from the latch 54 being handled as high-order 16 bits as shown in FIG. 10 and outputs it. Then, the arithmetic operation section 62 performs the CRC16 operation on the output data $D_3$ of 64 bits by using the output data $D_{14}$ fed from the latch 55, that is, the arithmetic operation result $CR_{22}$ in the example and produces an arithmetic operation result $CR_{23}$ and, as shown in FIG. 14(8), outputs it as the output data $D_8$. This arithmetic operation result $CR_{23}$ is the arithmetic operation result CRC16$_3$. The arithmetic operation result CRC16$_3$, as described above, is made up of two pieces of the arithmetic operation result blocks CRC16$_{30}$ and CRC16$_{31}$. The selector 64, during the fourth period #4, now selects the output data $D_8$ output from the arithmetic operation section 62, that is, the arithmetic operation result $CR_{23}$ in the example and outputs it as the output data $D_{10}$. Therefore, the latch 55 latches the output data $D_{10}$ from the selector 64, that is, the arithmetic operation result $CR_{23}$ in the example during a period of time being equivalent to one clock and, as shown in FIG. 14(9), outputs it as the output data $D_{14}$ during the fifth period #5.

The selector 65, during the second period #2 to the fourth period #4, selects the output data $D_{11}$ of 32 bits output from the latch 52, that is, any one of the byte data $BD_0$ to $BD_2$ and outputs it as the output data $D_{15}$. Moreover, the selector 65, during the fifth period #5, combines the output data $D_{11}$ from the latch 52, that is, the data blocks $DB_{12}$ in the example, the output data $D_{12}$ output from the latch 53, that is, the arithmetic operation result blocks CRC16$_{10}$ and CRC16$_{11}$ making up the arithmetic operation result CRC16$_1$, and the output data $D_{13}$ output from the latch 54, that is, the arithmetic operation result block CRC16$_{20}$ making up the arithmetic operation result CRC16$_2$ in the example into new byte data $BD'_3$ and outputs it as the output data $D_{15}$. Furthermore, the selector 65, during the sixth period #6, combines the output data $D_{13}$ from the latch 54, that is, the arithmetic operation result blocks CRC16$_{21}$ making up the arithmetic operation result CRC16$_2$ in the example and the output data $D_{14}$ output from the latch 55, that is, the arithmetic operation result blocks CRC16$_{30}$ and CRC16$_{31}$ making up the arithmetic operation result CRC16$_3$ into new byte data $BD_4$ and outputs it as the output data $D_{15}$. Therefore, the data outputting section 66, as shown in FIG. 14(10), performs waveform shaping on the output data $D_{15}$ of 32 bits output from the selector 65 and feeds it as the output data $D_{16}$ to the circuit elements at a later stage.

Thus, by using the data combining section 56, the byte data $BD_3$ being last data of the output data $D_1$ is combined with the arithmetic operation result $CR_{02}$ existing by one data before a final arithmetic operation result $CRC16_1$ is obtained in the arithmetic operation section 58 to produce 48 bits of output data $D_2$. Then, the arithmetic operation result $CRC16_2$ is obtained by the CRC16 operation performed by the arithmetic operation section 60 on the output data $D_2$ of 48 bits. Similarly, by using the data combining section 57, the byte data $BD_3$ being last data of the output data $D_1$ is combined with the arithmetic operation result $CR_{02}$ existing by one data before a final arithmetic operation result $CRC16_1$ is obtained in the arithmetic operation section 58 and with the arithmetic operation result $CR_{12}$ existing by one data before a final arithmetic operation result $CRC16_2$ is obtained in the arithmetic operation section 59 to produce 64 bits of output data $D_3$. Then, the arithmetic operation result $CRC16_3$ is obtained by the CRC16 operation performed by the arithmetic operation section 62 on the output data $D_2$ of 64 bits. This enables the arithmetic operation results $CRC16_1$ to $CRC16_3$ to be simultaneously obtained. As a result, a time delay being equivalent to only one clock occurs between inputting of the input data $D_0$ to the data inputting section 51 and outputting of the output data $D_{16}$ from the data outputting section 66. When data is transmitted in accordance with the data format shown in FIG. 6, as described in "Description of Related Art", if the arithmetic operation result $CRC16_2$ is obtained after the arithmetic operation result $CRC16_1$ has been obtained and if the arithmetic operation result $CRC16_3$ is obtained after the arithmetic operation result $CRC16_2$ has been obtained, a time delay being equivalent to three clock occurs between inputting of the input data $D_0$ to the data inputting section 51 and outputting of the output data $D_{16}$ from the data outputting section 66. That is, according to the second embodiment, time delay being equivalent to two clocks is reduced compared with the conventional case. Thus, the CRC arithmetic operation circuit of the second embodiment of the present invention can meet requirements for high-speed signal processing in data communications induced by high-speed operations of CPUs in recent years.

It is apparent that the present invention is not limited to the above embodiments but may be changed and modified without departing from the scope and spirit of the invention. For example, in the above embodiments, communications data is transmitted by four bytes, however, it may be transmitted by one byte, two bytes, eight bytes or by the more number of bytes. Moreover, in the above first embodiment, the CRC32 operation is performed on the header and data and the CRC16 operation is performed on the header, data, and arithmetic operation result CRC32. Also, in the above second embodiment, the first CRC16 operation is performed on the header and data, the second CRC16 operation is performed on the header, data, and arithmetic operation result $CRC16_1$, and the third CRC16 operation is performed on the header, data, arithmetic operation results $CRC16_1$, and $CRC16_2$. However, the present invention is not limited to this, that is, in the first embodiment, the CRC16 operation may be performed on the header and data and the CRC32 operation may be performed on the header, data, and arithmetic operation result CRC16. Similarly, in the second embodiment, the CRC32 operation may be performed on the header and data, the first CRC16 operation may be performed on the header, data and arithmetic operation result CRC32 and the second CRC16 operation may be performed on the header, data, and arithmetic operation results CRC32 and $CRC16_1$.

Moreover, the generative polynomial is not limited to the equations (1) and (2) shown above and any generative polynomial may be employed. Furthermore, the number of orders of the generative polynomial is not limited to the 32nd and 16th orders and 48th or 64th order may be employed. The number of the generative polynomials is not limited to two pieces and it may be three or four or more.

Thus, the present invention can be applied when the CRC operation is performed on data or a like two times or more.

What is claimed is:

1. An arithmetic operation method for a cyclic redundancy check in an arithmetic operation circuit which performs arithmetic operations for error detection on data to be transmitted using a plurality of generative polynomials and is used in a communications system in which transmission of said data is accomplished by adding a result from each of said arithmetic operations to said data, said arithmetic operation method comprising:

first arithmetic operation processing by a first arithmetic operation section in which a first arithmetic operation is performed on said data by a specified number of bits using a first generative polynomial;

second arithmetic operation processing by a second arithmetic operation section in which a second arithmetic operation is performed on said data by a specified number of bits using at least one piece of a second generative polynomial being same as or different from said first generative polynomial; and third arithmetic operation processing by a third arithmetic operation section in which a third arithmetic operation is performed on said data of a specified number of bits and on at least one piece of an arithmetic operation result being obtained at a midpoint in either of said first arithmetic operation or said second arithmetic operation, or in both said first arithmetic operation and second arithmetic operation.

2. The arithmetic operation method for the cyclic redundancy check in said arithmetic operation circuit according to claim 1, wherein, in said third arithmetic operation processing by said third operation section, said third arithmetic operation is performed by handling said data of said specified number of bits as low-order bits and by handling at least one piece of said third arithmetic operation result as high-order bits.

3. An arithmetic operation method for a cyclic redundancy check in an arithmetic operation circuit which performs arithmetic operations for error detection on data to be transmitted using a plurality of generative polynomials and is used in a communications system in which transmission of said data is accomplished by adding a result from each of said arithmetic operations to said data, said arithmetic operation method comprising:

first arithmetic operation processing by a first arithmetic operation section in which a first arithmetic operation is performed on said data by 32 bits using a thirty-second order generative polynomial;

second arithmetic operation processing by a second arithmetic operation section in which a second arithmetic operation is performed on said data by 32 bits using a sixteenth order generative polynomial; and third arithmetic operation processing by a third arithmetic operation section in which a third arithmetic operation is performed on said data of 32 bits and on the first arithmetic operation result of 32 bits being obtained at a midpoint in said first arithmetic operation processing using said sixteenth order generative polynomial.

4. The arithmetic operation method for the cyclic redundancy check in said arithmetic operation circuit according to claim 3, wherein, in said third arithmetic operation processing by said third operation section, said third arithmetic operation is performed by 64 bits in total by handling said data of 32 bits as low-order bits and said arithmetic operation result of 32 bits as high-order bits.

5. An arithmetic operation method for a cyclic redundancy check in an arithmetic operation circuit which performs arithmetic operations for error detection on data to be transmitted using a plurality of generative polynomials and is used in a communications system in which transmission of said data is accomplished by adding a result from each of said arithmetic operations to said data, said arithmetic operation method comprising:

first arithmetic operation processing by a first arithmetic operation section in which a first arithmetic operation is performed on said data by 32 bits using a sixteenth order generative polynomial;

second arithmetic operation processing by a second arithmetic operation section in which a second arithmetic operation is performed on said data by 32 bits using said sixteenth order generative polynomial;

third arithmetic operation processing by a third arithmetic operation section in which a third arithmetic operation is performed on said data of 32 bits and on a first arithmetic operation result of 16 bits being obtained at a midpoint in said first arithmetic operation processing using said sixteenth order generative polynomial;

fourth arithmetic operation processing by a fourth arithmetic operation section in which a fourth arithmetic operation is performed on said data by 32 bits using said sixteenth order generative polynomial; and fifth arithmetic operation processing by a fifth arithmetic operation section in which a fifth arithmetic operation is performed on said data of 32 bits, said first arithmetic operation result of 16 bits, and a second arithmetic operation result of 16 bits being obtained at a midpoint in said second arithmetic operation processing using said sixteenth generative polynomial.

6. The arithmetic operation method for the cyclic redundancy check by said arithmetic operation circuit according to claim 5, wherein, in said third arithmetic operation processing by said third arithmetic operation section, said arithmetic operation is performed by 48 bits in total by handling said data of 32 bits as low-order bits and said first arithmetic operation result of 16 bits as high-order bits and wherein, in said fifth arithmetic operation processing by said fifth arithmetic operation section, said fifth arithmetic operation is performed by 64 bits in total by handling said data of 32 bits as low-order bits, said first arithmetic operation result of 16 bits as middle-order bits, and said second arithmetic operation result of 16 bits as high-order bits.

7. An arithmetic operation circuit for a cyclic redundancy check which performs arithmetic operations for error detection on data to be transmitted using a plurality of generative polynomials and is used in a communications system in which transmission of said data is accomplished by adding a result from each of said arithmetic operations to said data, said arithmetic operation circuit comprising:

a first arithmetic operation section to perform a first arithmetic operation on said data by a specified number of bits using a first generative polynomial;

a second arithmetic operation section to perform a second arithmetic operation on said data by said specified number of bits using at least one piece of a second generative polynomial being same as or different from said first generative polynomial; and a third arithmetic operation section to perform a third arithmetic operation on said data of said specified number of bits and on at least one piece of an arithmetic operation result being obtained at a midpoint in either of said first arithmetic operation or said second arithmetic operation, or in both said first arithmetic operation and said second arithmetic operation using at least one piece of said second generative polynomial.

8. The arithmetic operation circuit for the cyclic redundancy check according to claim 7, further comprising a data combining section to combine said data of said specified number of bits handled as low-order bits with at least one piece of said arithmetic operation result handled as high-order bits and to feed combined results to said third arithmetic operation section.

9. An arithmetic operation circuit for a cyclic redundancy check which performs arithmetic operations for error detection on data to be transmitted using a plurality of generative polynomials and is used in a communications system in which transmission of said data is accomplished by adding a result from each of said arithmetic operations to said data, said arithmetic operation circuit comprising:

a first arithmetic operation section to perform a first arithmetic operation on said data by 32 bits using a thirty-second order generative polynomial;

a second arithmetic operation section to perform a second arithmetic operation on said data by 32 bits using a sixteenth order generative polynomial; and a third arithmetic operation section to perform a third arithmetic operation on said data of 32 bits and on an arithmetic operation result of 32 bits being obtained at a midpoint in said first arithmetic operation section using said sixteenth order generative polynomial.

10. The arithmetic operation circuit for the cyclic redundancy check according to claim 9, further comprising a data combining section to combine said data of 32 bits handled as low-order bits with said first arithmetic operation result of 32 bits handled as high-order and to feed combined results to said third arithmetic operation section.

11. An arithmetic operation circuit for a cyclic redundancy check which performs arithmetic operations for error detection on data to be transmitted using a plurality of generative polynomials and is used in a communications system in which transmission of said data is accomplished by adding a result from each of said arithmetic operations to said data, said arithmetic operation circuit comprising:

a first arithmetic operation section to perform a first arithmetic operation on said data by 32 bits using a sixteenth order generative polynomial;

a second arithmetic operation section to perform a second arithmetic operation on said data by 32 bits using said sixteenth order generative polynomial;

a third arithmetic operation section to perform a third arithmetic operation on said data of 32 bits and on a first arithmetic operation result of 16 bits being obtained at a midpoint in said first arithmetic operation section using said sixteenth order generative polynomial;

a fourth arithmetic operation section to perform a fourth arithmetic operation on said data by 32 bits using said sixteenth order generative polynomial; and a fifth arithmetic operation section to perform a fifth arithmetic operation on said data of 32 bits, said first arithmetic operation result, and a second arithmetic operation result of 16 bits being obtained at a midpoint in said second arithmetic operation section using said sixteenth order generative polynomial.

12. The arithmetic operation circuit for the cyclic redundancy check according to claim 11, further comprising:
a first data combining section to combine said data of 32 bits with said first arithmetic operation result and to feed a combined result to said third arithmetic operation section, wherein as said combined result, said data of 32 bits is placed at low-order bits and said first arithmetic operation result is placed at high-order bits, and a second data combining section to combine together said data of 32 bits, said first arithmetic operation result, and said second arithmetic operation result and to feed a combined result to said fifth arithmetic operation section, wherein as said combined result said data of 32 bits is placed at low-order bits and said first arithmetic operation result is placed at middle-order bits, and said second arithmetic operation result is placed at high-order bits.

* * * * *